United States Patent
Waite

(10) Patent No.: US 10,956,628 B2
(45) Date of Patent: Mar. 23, 2021

(54) HIGH PERFORMANCE COMPUTING ON A PUBLIC GRID

(71) Applicant: Autodesk, Inc., San Rafael, CA (US)

(72) Inventor: David Marc Waite, Scottsdale, AZ (US)

(73) Assignee: AUTODESK, INC., San Rafael, CA (US)

( * ) Notice: Subject to any disclaimer, the term of this patent is extended or adjusted under 35 U.S.C. 154(b) by 254 days.

(21) Appl. No.: 15/499,685

(22) Filed: Apr. 27, 2017

(65) Prior Publication Data

US 2018/0314508 A1 Nov. 1, 2018

(51) Int. Cl.
*G06F 30/20* (2020.01)
*G06F 9/50* (2006.01)

(52) U.S. Cl.
CPC ............ *G06F 30/20* (2020.01); *G06F 9/5066* (2013.01)

(58) Field of Classification Search
CPC ................................ G06F 30/20; G06F 9/5066
See application file for complete search history.

(56) References Cited

U.S. PATENT DOCUMENTS

| | | | | |
|---|---|---|---|---|
| 5,347,450 A * | 9/1994 | Nugent | ............. | G06F 15/17368 370/440 |
| 8,639,818 B1 * | 1/2014 | Vladimirov | ......... | G06F 11/3452 709/226 |
| 2009/0006156 A1 * | 1/2009 | Hunt | ...................... | G06Q 30/02 705/7.11 |
| 2015/0130825 A1 * | 5/2015 | Liao | ...................... | G06F 9/5066 345/543 |

OTHER PUBLICATIONS

Acosta et Al., A pipeline virtual environment architecture for multicore processor systems, Dec. 14, 2011, Springer, p. 1-16 (Year: 2011).*

Wes Kendall, MPI Send and Receive, Feb. 24, 2015, MPI Tutorial, p. 1-7 (Year: 2015).*

(Continued)

*Primary Examiner* — Omar F Fernandez Rivas
*Assistant Examiner* — Michael Edward Cocchi
(74) *Attorney, Agent, or Firm* — Gates & Cooper LLP

(57) ABSTRACT

A method and system provide performance computing on a public grid. A computational mesh to solve a received engineering simulation (that has computations/processes) is computed. The mesh divides the CAD model up spatially into elements where conservation equations are formed. Mesh vertices identify nodes where field variables are defined. Each process owns a node/element and is assigned to a mesh partition. A solver application installed on each computer and each computer CPU spawns a thread to each CPU core. A matrix is assembled by each thread that computes numerical operators (that are stored as a coefficient matrix) that represent the conservation equations. The matrix is solved by solving the equations represented by the coefficient matrix. The solving yields field vectors that update the field variables at the nodes. The engineering solution is rendered based on the updated field variables.

24 Claims, 15 Drawing Sheets
(8 of 15 Drawing Sheet(s) Filed in Color)

(56) References Cited

OTHER PUBLICATIONS

Grove, Performance Modelling of Message-Passing Parallel Programs, May 30, 2003, Department of Computer Science of the University of Adelaide, pp. 1-313 (Year: 2003).*
Y. Yilmaz et al. Parallel Mesh Generation, Migration and Partitioning for the Elmer Application, 2012, p. 1-12 (Year: 2012).*
Randolf Rotta, Parallelization and Load Balancing Strategies for Hierarchical SAMR Algorithms, internship report, SURF 2004/2005, p. 1-39, 2005 (Year: 2005).*
Mesri, Y, et al., "Mesh Partitioning for Parallel Computational Fluid Dynamics Applications on a Grid", Jan. 2005, pp. 1-12.

* cited by examiner

FIG. 6B

HIGH PERFORMANCE COMPUTING ON A PUBLIC GRID

BACKGROUND OF THE INVENTION

1. Field of the Invention

The present invention relates generally to engineering simulations, and in particular, to a method, system, apparatus, and article of manufacture for engineering simulations conducted on a public grid with limited network capability.

2. Description of the Related Art

When doing advanced engineering simulation on several machines (known as clusters), there is a requirement for a certain amount of message passing between the machines that make up the cluster. Historically, the message passing requirements for engineering simulations are high and as such, high performance network hardware evolved and was employed. These HPC (high-performance computing) network solutions allow good scalability as the number of machines making up a cluster increases.

Public grids, like AWS/GOOGLE CLOUD (AWS— AMAZON WEB SERVICES), have powerful computers, but they do not have high performance networks linking these machines together. Accordingly, what is needed is the ability to utilize a standard network to execute advanced engineering simulations. To better understand the problems of the prior art, a description of prior art simulations may be useful.

Typically, a designer/analyst has a computer-aided-design (CAD) model that represents the geometry of parts/assembly. CAD models are processed through other computer programs that allow the geometry to be sliced into a three-dimensional (3D) volumes (mesh), and to apply conditions under which the parts/assembly operate (preprocessor). A simulation may be used to evaluate various parameters of the CAD model. For example, a simulation of a CAD model with a bathtub and a spigot may fill the bathtub with water and an operating parameter may be the amount of water. Further, the simulation may simulate water flowing into the tub, what the surface waves look like, the temperature, pressure, flow rate, etc. Such a simulation may include conversion into an animation so that the user can review the performance. Based on the simulation, the user/analyst can then modify the geometry and operating parameters to look for more optimal conditions (e.g., changing the flow rate of hot/cold water, etc.).

In the prior art, simulation software computes the performance of the assembly being analyzed. Historically, this software was executing on a single CPU (central processing unit) on a single computer. Modern computer networks may now conduct a single (or multiple) simulations on multiple computers that each have multiple CPUs (all of which may be working on the same problem/simulation). For example, for scientific calculations, due to the computational expense and amount of messaging required, most prior art systems assume/require the use of a high-performance network. Thus, traditionally, high performance networks were used/required to perform the simulations by individual high performance computers. However, such high performance networks are expensive and often cost more than the computers themselves. For example, computational fluid dynamics (CFD) applications usually operate on a huge set of application data. For this reason, CFD problems represent a fair amount of high performance supercomputing applications.

Due to the requirement of high performance networks, many simulations are required to be executed in a government owned lab using government owned computers. Over time, computers have improved their speed. However, the bottleneck for executing simulations remains the network on which the computers are executing/communicating. Recently, public grids such as AWS and/or GOOGLE CLOUD have become more widely used. However, the high performance computing requirements of the prior art would not permit the use of such public grids. Nonetheless, it is desirable to use such public grids due to the scalability and potential use of thousands if not millions of computers to execute the simulations/calculations. Embodiments of the invention attempt to overcome the problems of the prior art by utilizing public grids to perform advanced engineering simulations.

SUMMARY OF THE INVENTION

Embodiments of the invention provide a simulation tool that that has good scalability using public grids where limited network capability is the norm. A variety of strategies are utilized to compute engineering solutions efficiently on such public grids.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Referring now to the drawings in which like reference numbers represent corresponding parts throughout:

FIG. 6B illustrates an exemplary layout of a coefficient matrix in accordance of one or more embodiments of the invention;

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
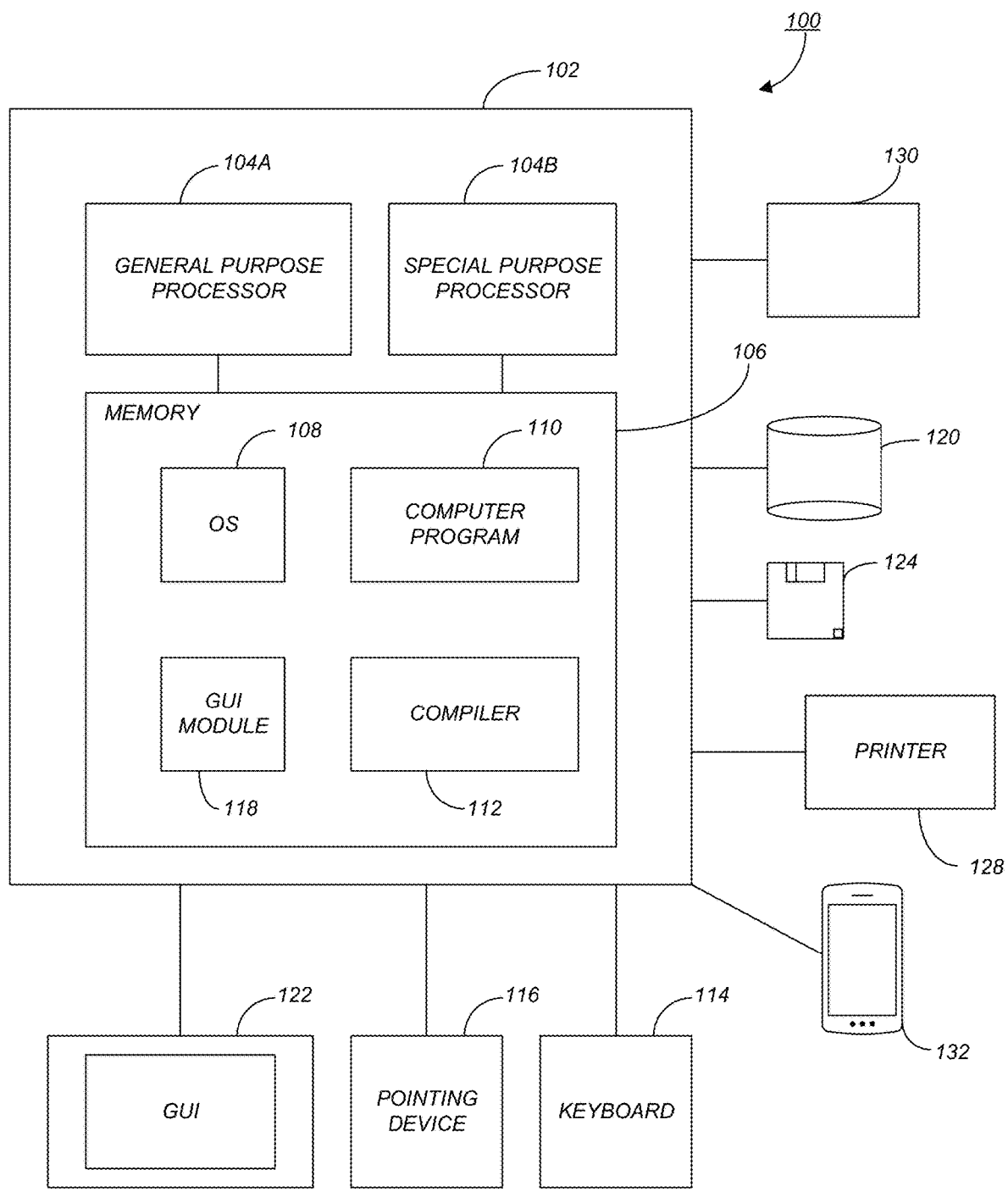
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor (central processing unit [CPU]) 104A and/or a special purpose hardware processor 104B (hereinafter alternatively collectively referred to as processor 104) and a memory 106, such as random access memory (RAM). In one or more embodiments of the invention, computer 100 has two CPUs 104, each with many cores. The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, IPOD, NOOK, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118. Although the GUI module 118 is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD), portable/handheld game/music/video player/console devices (e.g., IPOD TOUCH, MP3 players, NINTENDO 3DS, PLAYSTATION PORTABLE, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 110 instructions. In one embodiment, the special purpose processor 104B is an application specific integrated circuit (ASIC).

The computer 102 may also implement a compiler 112 that allows an application or computer program 110 written in a programming language such as C, C++, Assembly, SQL, PYTHON, PROLOG, MATLAB, RUBY, RAILS, HASKELL, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transitory computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program 110 instructions which, when accessed, read and executed by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
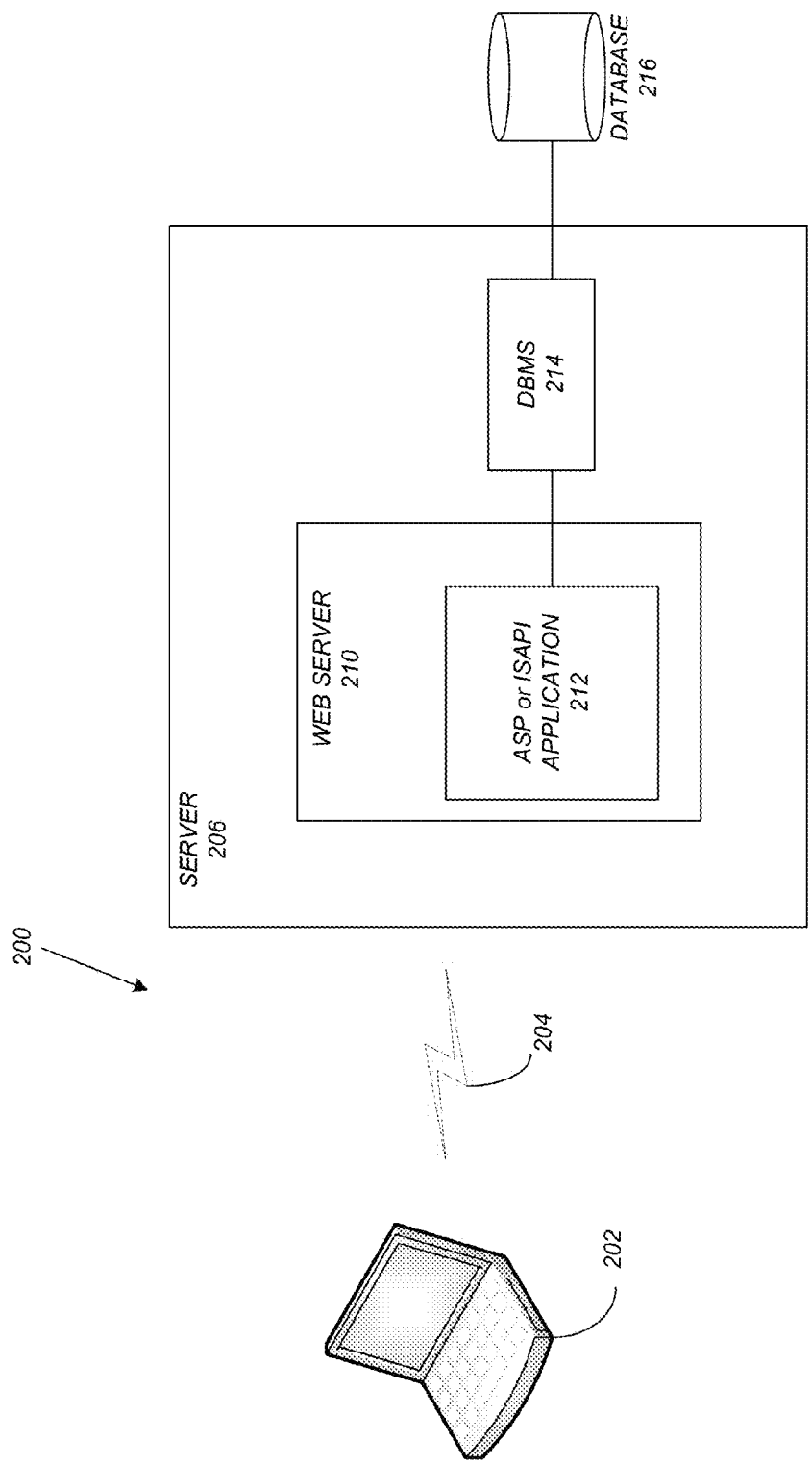
FIG. 2 schematically illustrates a typical distributed/cloud-based computer system in accordance with one or more embodiments of the invention.

FIG. 2 schematically illustrates a typical distributed/cloud-based computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations (as set forth in FIG. 1), and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize Ethernet, coaxial cable, wireless communications, radio frequency (RF), etc. to connect and provide the communication between clients 202 and servers 206. Further, in a cloud-based computing system, resources (e.g., storage, processors, applications, memory, infrastructure, etc.) in clients 202 and server computers 206 may be shared by clients 202, server computers 206, and users across one or more networks. Resources may be shared by multiple users and can be dynamically reallocated per demand. In this regard, cloud computing may be referred to as a model for enabling access to a shared pool of configurable computing resources.

Clients 202 and servers 206 may be networked with 1 or 10 GigE Ethernet hardware. One and ten GigE Ethernet is considered "standard" network hardware in one or more embodiments of the invention. As described above, the latency and bandwidth performance of a standard network is normally not adequate for many of the modern engineering calculations performed in parallel/cloud computing environments. Embodiments of the invention may utilize such a standard network yet provide the efficiency and computational capability of a high-performance network.

Clients 202 may execute a client application or web browser and communicate with server computers 206 executing web servers 210. Such a web browser is typically a program such as MICROSOFT INTERNET EXPLORER, MOZILLA FIREFOX, OPERA, APPLE SAFARI, GOOGLE CHROME, etc. Further, the software executing on clients 202 may be downloaded from server computer 206 to client computers 202 and installed as a plug-in or ACTIVEX control of a web browser. Accordingly, clients 202 may utilize ACTIVEX components/component object model (COM) or distributed COM (DCOM) components to provide a user interface on a display of client 202. The web server 210 is typically a program such as MICROSOFT'S INTERNET INFORMATION SERVER.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S TRANSACTION SERVER (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206.

Software Embodiment Overview

Embodiments of the invention are implemented as a software application on a client 202 or server computer 206. Further, as described above, the client 202 or server computer 206 may comprise a thin client device or a portable device that has a multi-touch-based display.

Most engineering simulations involve a meshing process where the parts making up an assembly are decomposed into millions of volumes or elements. Each element has nodes that represent points in the problem domain where field variables are evaluated. Conservation equations (i.e., equations that express a conservation of a quantity, be it mass, energy, volume, or some other scalar) are evaluated element by element and are assembled into a global system of linear equations. Solutions of these system of equations yield estimates of field variables and these outputs provide valuable insight into the physical behavior of the scenario being analyzed.

Embodiments of the invention match software design to the hardware that the software is operating on. For example, a solver application may be placed on each CPU 104 of each computer 100/202/206 that is used in a computation. A standard network 204 between computers 100/202/206 allow solver application processes to communicate with each other. This communication is known as message passing and an MPI (message passing interface) may be employed as the communication protocol. Each solver application process spawns a thread to each core making up the CPU 104 and these threads do the bulk of the computing.

To achieve high scalability in the cloud/cluster environment, the following factors are considered in one or more embodiments of the invention:

(a) Message passing must be kept to a minimum;
(b) Thread efficiency must be maximized;
(c) Process and thread workloads need to be parsed accurately so that task completion time is the same on each thread and on each process; and
(d) Cache performance should be maximized by accessing data sequentially in memory.

To better understand the invention, a description of conducting processing/simulations across multiple computers 100/202/206 that are part of what is referred to as a computational cluster may be useful. The computational cluster is made up of many computational nodes. One node is designated as the head node that will be used for some single process computations, simulation tasks, and as a point of contact for the cluster. The other compute nodes are designated as slave nodes and their role is to perform simulation tasks.

Figure 3:
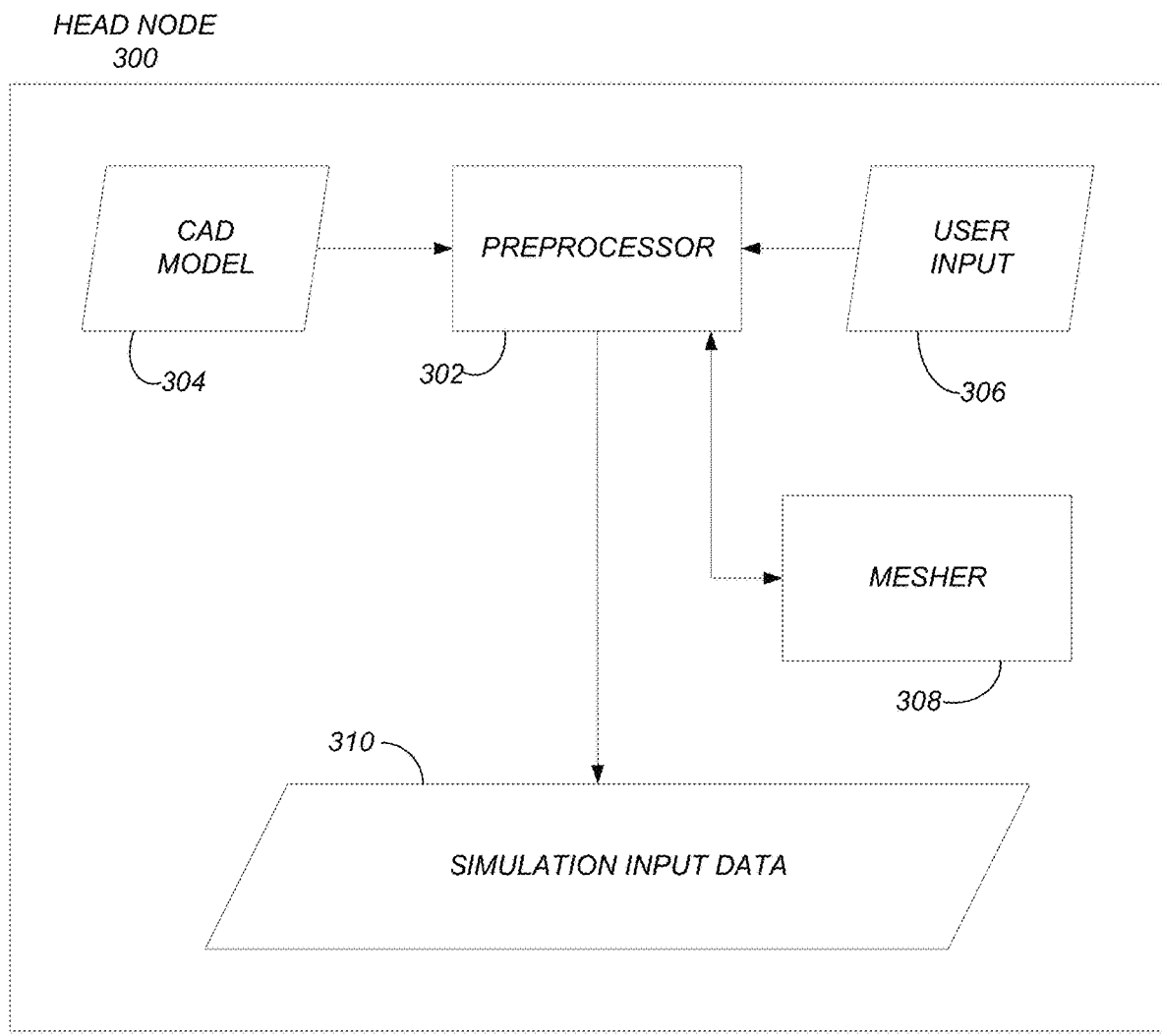
FIG. 3 illustrates the logical flow for the processing conducted by a head node during initial stages of a simulation in accordance with one or more embodiments of the invention.

FIG. 3 illustrates the logical flow for the processing conducted by a head node during initial stages of a simulation in accordance with one or more embodiments of the invention. Within the head node 300, a preprocessor 302 reads in a CAD model 304 that describes the geometry of the assembly to be analyzed. A user provides (in user input 306) material property data, boundary condition data, and run time control data to the preprocessor 302. The geometry and the user data is sent to a mesher 308 that divides up the parts into millions of elements. These elements are four node tetrahedral elements. At the vertices of each elements are nodes. The collection of these elements and nodes are known as the mesh. This mesh data is returned to the preprocessor 302 where it is combined with the material property data, boundary condition data, and run time control data which is then written to a simulation input data file 310. The simulation input data file 310 is written to a directory on the head node 300 that is shared via the network to all the slave compute nodes.

Figure 4:
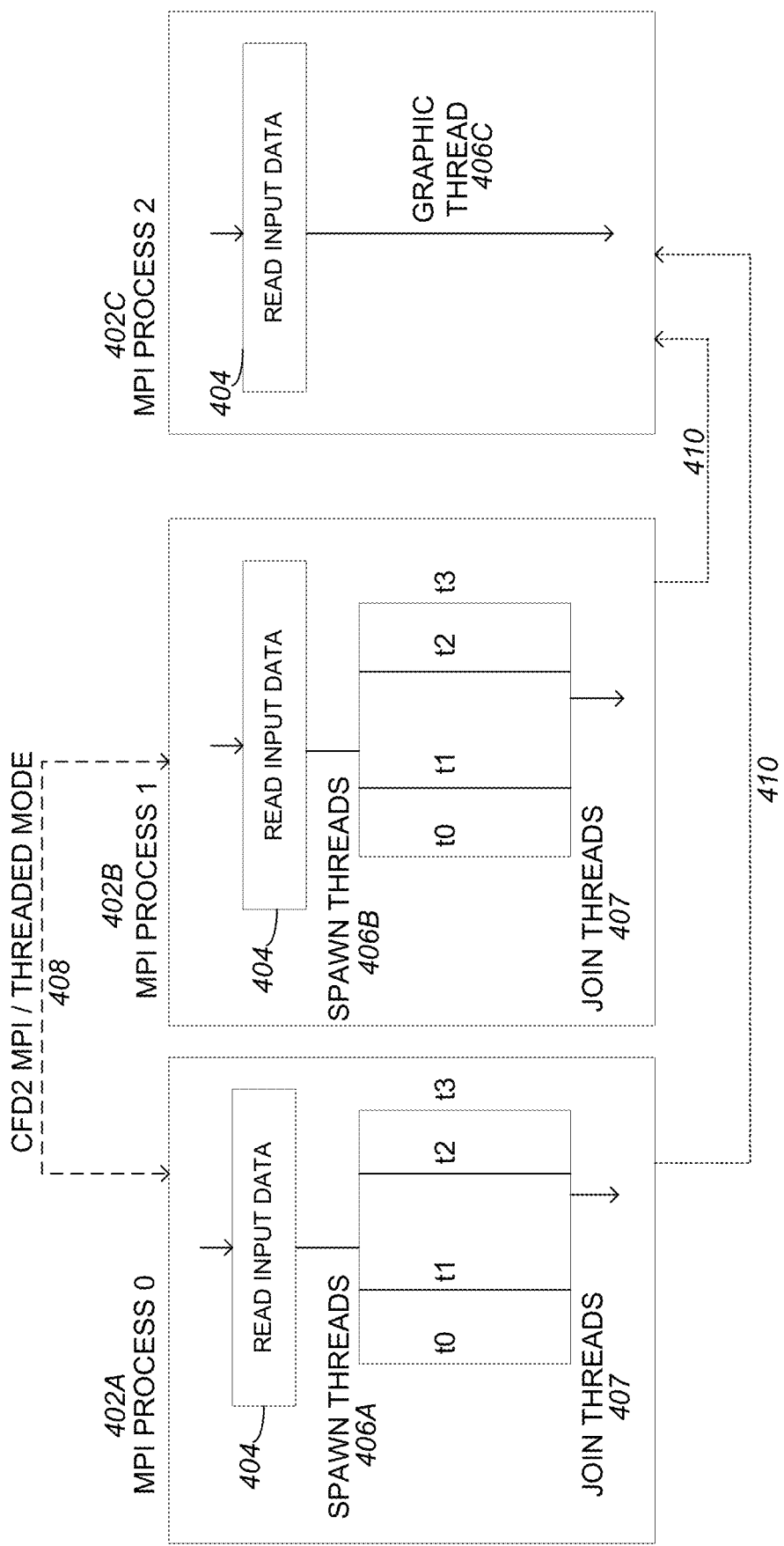
FIG. 4 illustrates an overview of head node processing in accordance with one or more embodiments of the invention.

FIG. 4 illustrates an overview of head node 300 processing in accordance with one or more embodiments of the invention. On the head node 300 there are typically three (3) MPI processes 402A, 402B, 402C (collectively referred to as processes 402) running. MPI process 0 402A and MPI process 1 402B are considered worker processes that will perform simulation tasks. MPI process 2 402C is a graphic process that computes a rendering model. Each of the worker processes 402A/402B will read 404 the simulation data 310 and build a localized model based on a 1/N geometric partition of the mesh. Each process 402A/402B will spawn 406A/406B additional threads (t0-t3) that do the bulk of the computational work in the simulation. Towards the end of the simulation, the threads are joined (407) (and process 402C will spawn a graphic thread 406C) so that the computation can be distributed across all the cores contained within each process 402.

Dashed line 408 represents message passing between worker processes 402A and 402B. Dotted lines 410 represent message passing from worker processes 402A/402B to the graphic process 402C. Slave nodes may also have two worker processes 402A/402B and these worker processes 402A/402B will also participate in worker message passing and messaging directed to the graphic processes 402C.

Figure 5:
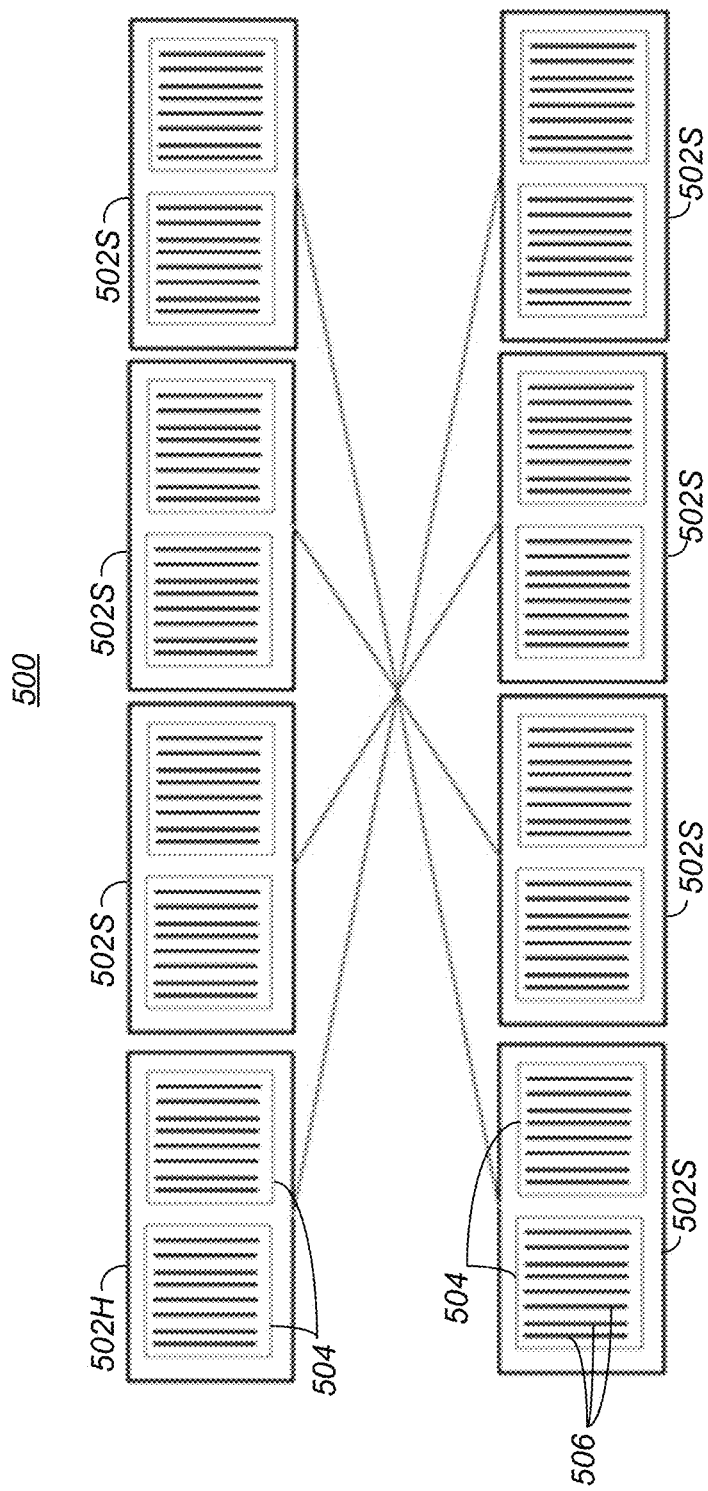
FIG. 5 illustrates a typical machine cluster in accordance with one or more embodiments of the invention.

Focusing on the worker processes 402A/402B, FIG. 5 illustrates a typical machine cluster in accordance with one or more embodiments of the invention. The process begins with eight (8) compute nodes 502 making up the cluster 500. There is one head node 502H and seven slave nodes 502S (collectively referred to as compute nodes 502). The machines have two sockets 504 each, one CPU in each socket 504, and each CPU contains eight (8) computational cores 506. Viewed as a computational array:

Cluster=8 compute nodes=16 MPI processes=128 cores

To obtain peak numerical performance the embodiments of the invention map to this hardware schematic. In a computational process of embodiments of the invention, the simulation of physical processes involves the numerical construction of the governing (conservation) equations. The partial differential conservation equations can be converted to a large sparse matrix.

Figure 6A:
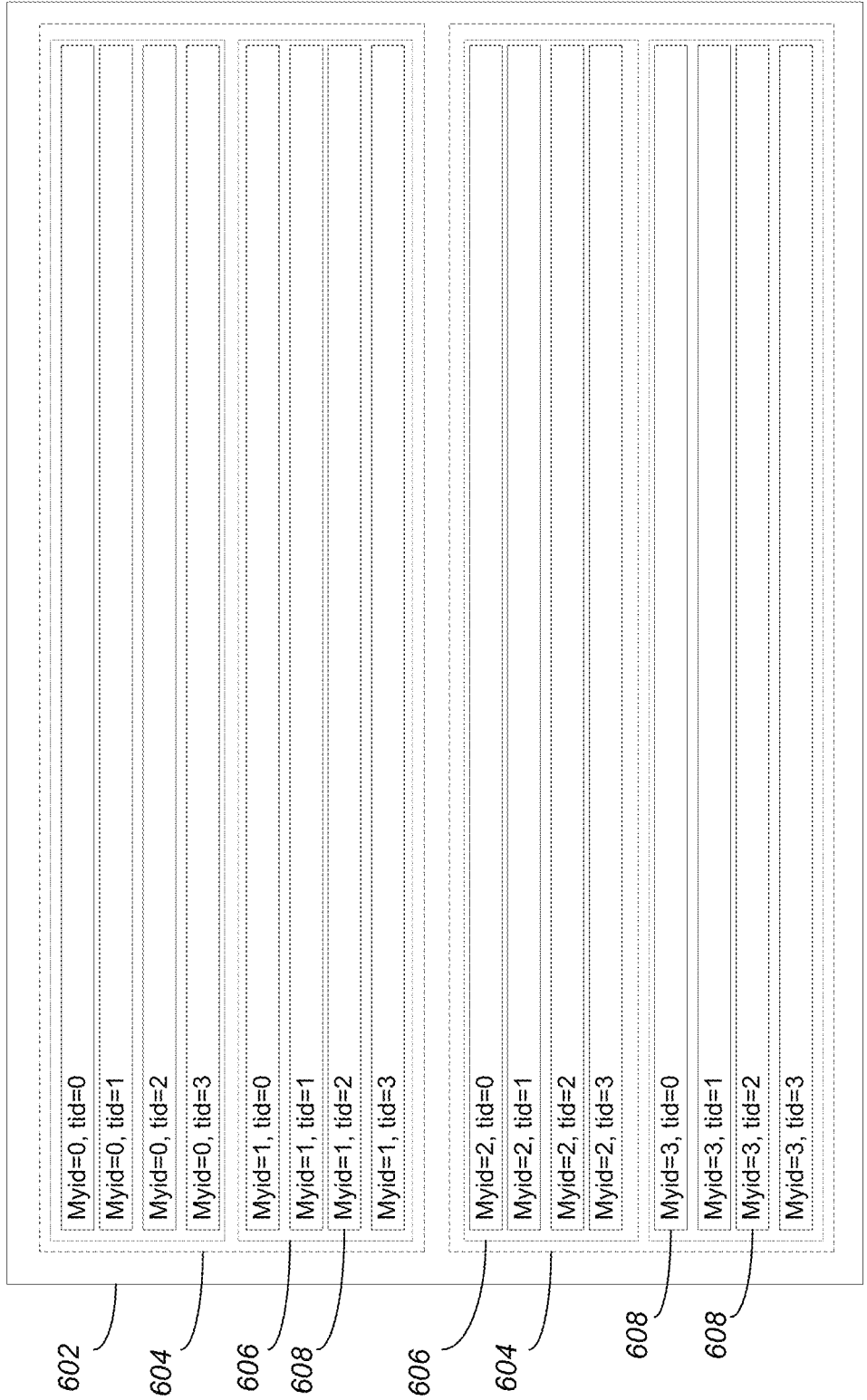
FIG. 6A illustrates the structure for a coefficient matrix in accordance with one or more embodiments of the invention.

Considering a cluster with two compute nodes 502, dual CPUs, four threads per CPU, the structure of this coefficient matrix can be viewed as illustrated in FIG. 6A. Box 602 represents the cluster. Boxes 604 represent the compute nodes. Each box 606 represents a MPI process. Each box 608 represents a thread spawned by each MPI process 606. Note that conservation equations have been effectively mapped to the hardware. Each thread 608 contains a contiguous row block. Each row represents the equation relationship for one of the mesh nodes.

Once all the row blocks have been computed by the threads 608, a matrix solver can be used to solve this linear system. Since these solvers involve row-vector products, the solvers are configured to efficiently use the row-wise thread data. The solution of these matrices yields the field values at all the mesh nodes in a model. Once all the conservation equations have been formed and solved, the resulting field vectors can be message passed to the graphic process where image rendering can begin. Typically, these systems of conservation equations are non-linear and interrelated, so this computational process is repeated over and over again until a steady solution is reached or a time transient is completed.

One or more embodiments of the invention employ one or more of the following to compute engineering solutions efficiently on public grids:

(1) The computational mesh is geometrically partitioned early in the simulation process. This determines processor ownership of nodes and elements so all data local to a process is easily defined;
(2) An extra layer of elements is added to each mesh partition so that all locally owned nodes have all the data they need during matrix assemble. This avoids sending any element contributions via message passing;

(3) Local node and element numbering is used on each partition and this allows for "local" assembly, which when carried into the solve phase, avoids any mapping or renumbering overheads;

(4) The only type of message passing required is for the ghost nodes on the partition boundaries, which keeps the code simple;

(5) Element assembly is done using a coloring scheme that avoids threading memory contention;

(6) Nodal ownership is determined on the mesh partition boundary in such a way as to balance the "owned" node count between partitions;

(7) Thread load balancing is determined using a novel, "on-the-fly", "for" loop, thread boundary optimizer;

(8) A novel combination of approximate and exact matrix solvers are employed to minimize message passing and overall wall clock time;

(9) Sequential memory access of large matrix structures are used to achieve high cache line performance;

(10) Communication rings are used during message passing to ensure that all process communicate in an efficient manner;

(11) Unique instrumentation identifies bottle necks and cache performance inconsistencies among processes;

(12) Message passing is performed only at certain stages in the overall simulation. Frequency parameters determine at which iteration message passing will be done. These parameters are determined by doing sensitivity studies such that the overall wall clock is minimized and solution stability is ensured; and

(13) A cluster configurator and launcher ease installation and running of the code.

Each of the above thirteen areas/criteria are discussed in detail below.

Software Embodiment Details

Geometric Partition

An engineering simulation (e.g., in a CFD application) is typically done using a computational mesh to represent the domain of interest. For example, if one wanted to predict the pressure drop as air flows thought a valve, a CAD model of the flow region within the valve would be divided up spatially into small volumes or elements. The vertices of these elements are known as nodes. The elements represent volumes where the conservation equations can be formed. The vertices or nodes are points of interest where field variables are defined.

When using multiple compute nodes, the computation mesh needs to be distributed across the machines making up the cluster. The process of dividing up/mapping an application onto a grid/cluster of machines/computational mesh is referred to as partitioning the application. Partitions are clumped in order to minimize the connection matrix between adjacent mesh partitions. This will minimize message passing. One mesh partition is assigned to each process making up the overall computation. This mapping concept is extended to the idea that each process will own certain elements and nodes within its mesh partition. The idea of ownership means that a process is responsible for determining element and node properties within the overall computation and any other process that references items outside its ownership will rely on the process (that owns these items) to provide them. Examples of element properties are material properties like viscosity, specific heat, thermal conductivity, etc. Node properties are typically values of pressure, temperature, velocity, etc. These node values are typically called field values or field vectors. The computational mesh is geometrically partitioned early in the simulation process. This geometric partitioning determines processor ownership of nodes and elements so all data local to a process is easily defined at the problem definition stage.

The splitting or decomposition of the geometry is just a process of cutting the assembly to be analyzed into N pieces. N is equal to the number of worker processes 402A/402B that are computing the simulation solution. For example, if the assembly to be analyzed was a brick and there are sixteen (16) processes, the brick would be cut into 16 pieces along the long dimension. Piece 0 is associated with process 0, piece 1 is associated with process 1, and so on. The partitioning is sometimes called geometry partitioning because the geometry is being partitioned into pieces. Each process has computational responsibility for the mesh entities (elements and nodes) in its partition. The partitioning is done with software that constructs a mesh connection graph and then this graph is partitioned such that the partition boundary is minimized. This means that each partition is a single group of connected elements and this procedure should minimize the amount of message passing between adjacent processes.

Figure 7A:
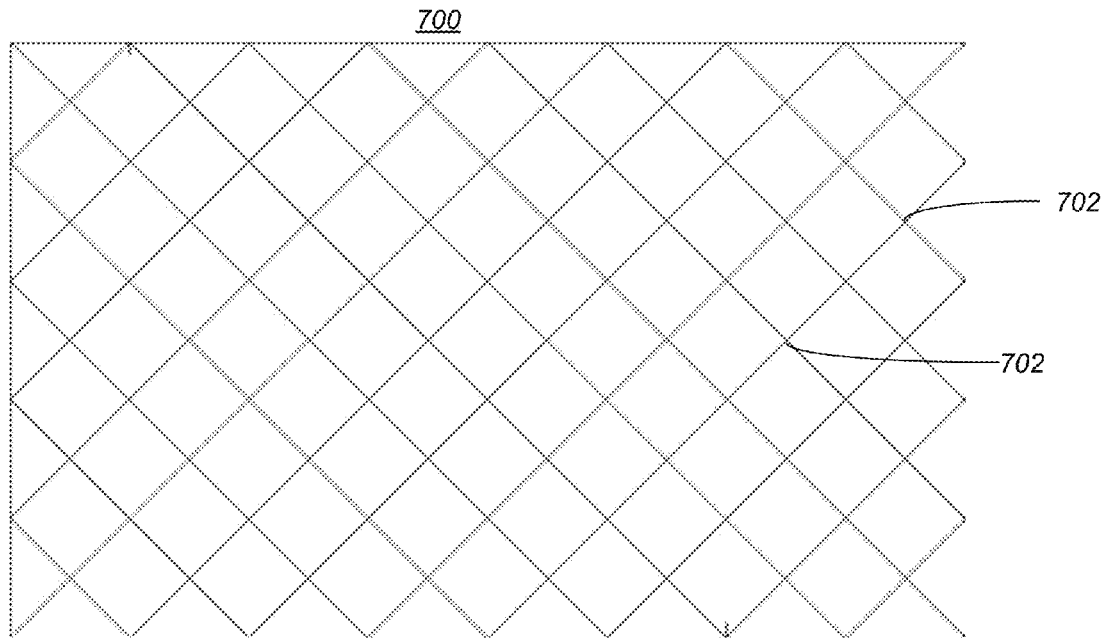
FIG. 7A illustrates the results of a meshing in accordance with one or more embodiments of the invention.

To illustrate the mesh and partitioning process, one can start with a simple two-dimensional example—a rectangular object that is to be analyzed. In the meshing step, the domain is paved with triangular and rectangular elements. At each vertex, a computational node exists. FIG. 7A illustrates the results of the meshing step with a mesh 700 that includes elements and computational nodes at each vertex 702.

Figure 7B:
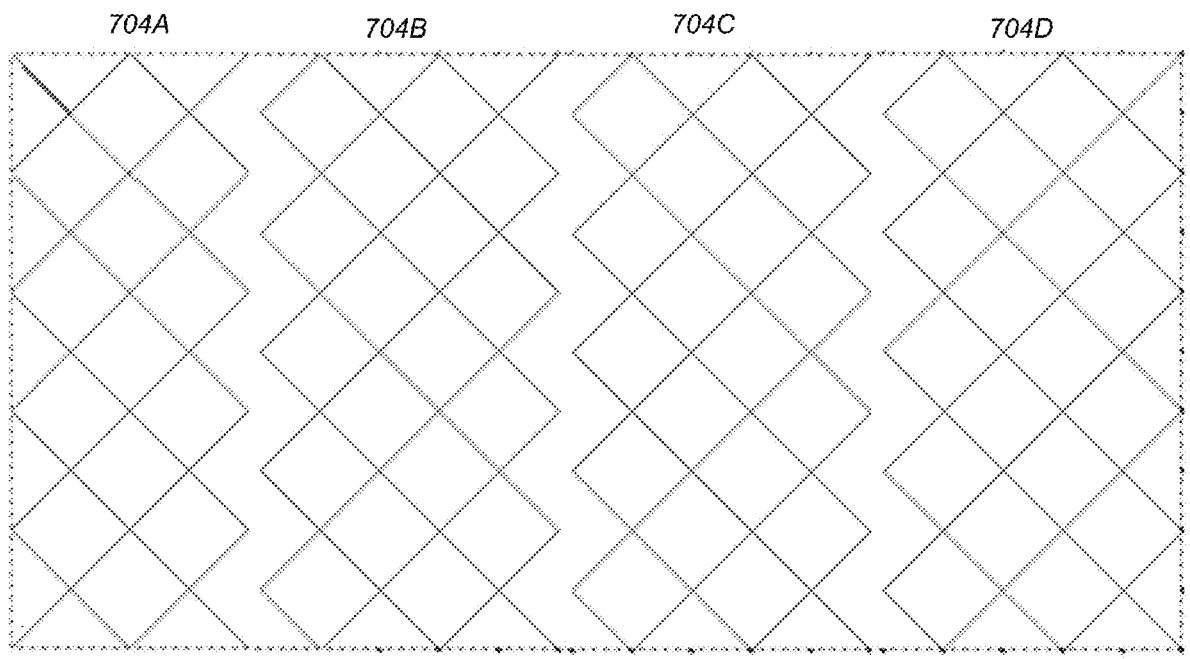
FIG. 7B illustrates the decomposition of a mesh into four partitions in accordance with one or more embodiments of the invention.

FIG. 7B illustrates the decomposition of mesh 700 into four partitions 704A-704D. Each partition 704A-704D is associated with a process. The left most partition 704A would belong to process 0, the next partition over 704B to process 1 and so on.

Figure 7C:
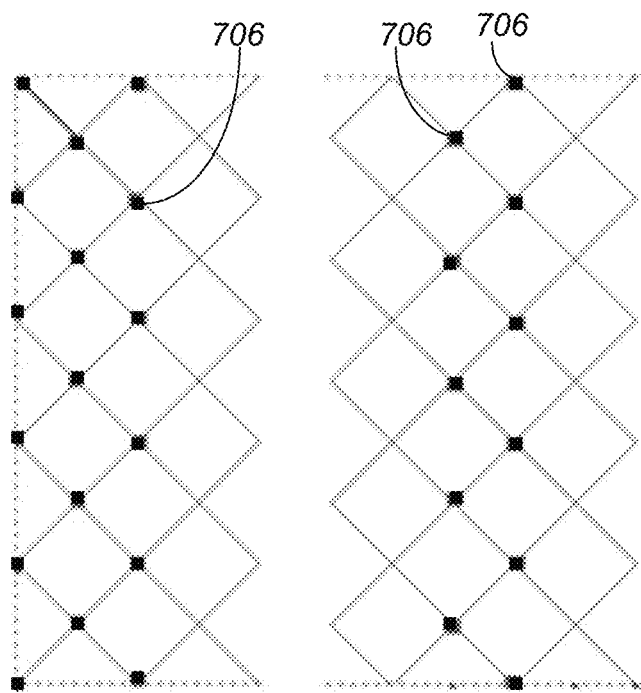
FIG. 7C illustrates node ownership in accordance with one or more embodiments of the invention.

Owned nodes are defined in a two-step procedure. FIG. 7C illustrates node ownership in accordance with one or more embodiments of the invention. On each process, nodes that are referenced by only the local process are marked as owned. For processes 0 and 1, the nodes marked with a dot 706 are locally owned by each process.

Next, the nodes on the partition boundary (nodes being referenced by both process 0 and 1) are assigned ownership based on the owned node count of each process. For example, process 0 has seventeen (17) owned nodes after the first phase of the ownership process. Process 1, has eleven (11) owned nodes after the first phase of the ownership process. Since the owned count of process 1 is less than the owned count of process 0, the next node on the partition boundary will be assigned to process 1 as an owned node. Starting from the bottom of the partition boundary, node ownership is assigned to process 1 until its owned node count equal that of process 0. After that, ownership is alternatively assigned to the process such that their owned node counts remain roughly the same. The nodes 708 show the assignments.

Each owned node assigned to each process will generate a row of coefficients in the global matrix of FIG. 6A when conservation equations are formed. Equations may be formed via the Finite Element Method. In this method, partial differential operators are replaced by numerical approximations. Numerical integrations over each element yields elemental matrices that are then assembled to the nodes of that element. As a consequence, the contributions to the coefficient matrix for a particular node results from the elements that reference that node. This numerical process is known as element assembly.

Figure 7D:
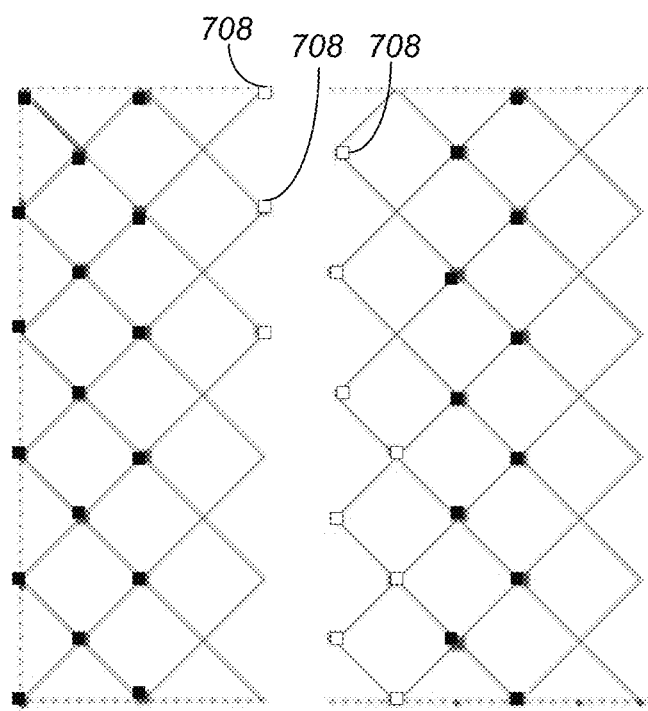
FIG. 7D illustrates an owned node diagram in accordance with one or more embodiments of the invention.
Figure 7E:
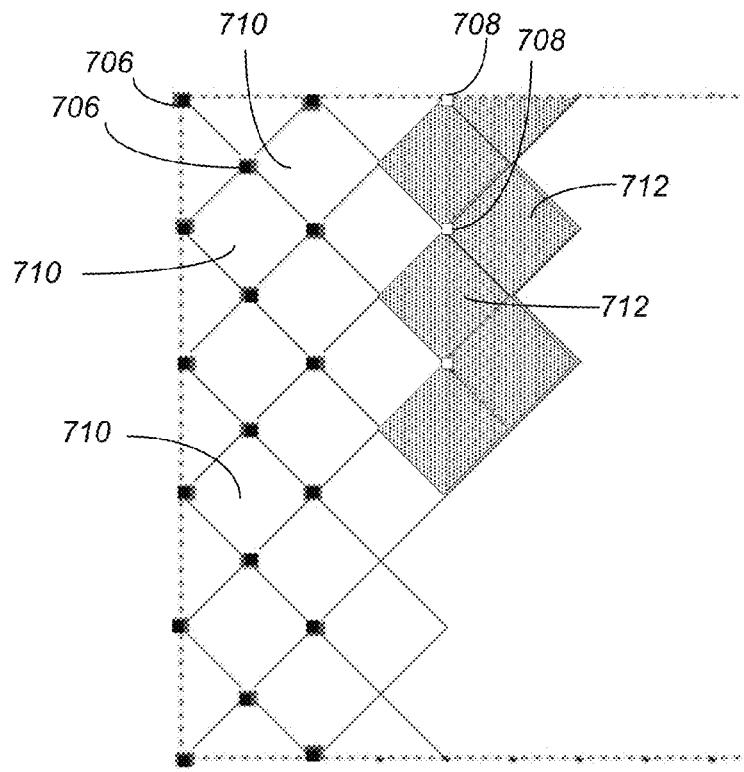
FIG. 7E illustrates non-owned elements and nodes that do not require message passing in accordance with one or more embodiments of the invention.

Looking back at the owned node diagram of FIG. 7D, one can see that the nodes 706 are assembly complete in the sense that the elements referencing them are all locally owned elements of the given process partition. Nodes 708 are being referenced by both partitions and as a result, matrix coefficient contributions computed by one process would have to be message passed to the owned node on the other partition. Such message passing is not desired because coefficient matrix data is fairly verbose. The better approach is to add some non-owned elements to each partition boundary such that all owned nodes will be assembly compete. Looking at partition 0 (i.e., the left side of FIG. 7D), this would involve adding six non-owned elements such that the assembly for the three nodes 708 of FIG. 7E could be completed without resorting to message passing. Accordingly, FIG. 7E illustrates non-owned elements and nodes that do not require message passing in accordance with one or more embodiments of the invention.

Figure 7F:
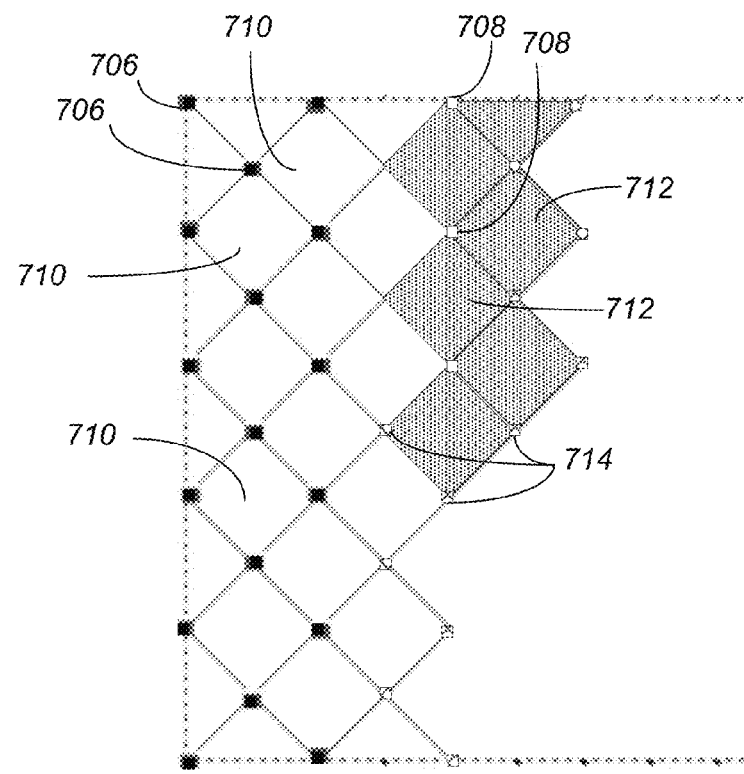
FIG. 7F illustrates an overview of all nodes, owned and non-owned, as well as elements owned and non-owned in accordance with one or more embodiments of the invention.

To summarize, the elements 710 are owned by the local process. The patterned elements 712 are non-owned, but required to assemble coefficients to the owned nodes. The nodes 706 and 708 are owned by the local process. FIG. 7F illustrates an overview of all nodes, owned and non-owned, as well as elements owned and non-owned in accordance with one or more embodiments of the invention. The patterned nodes 714 are non-owned, but they are required to define the elements of the partition.

Non-owned nodes 714 and elements 712 are typically called ghost nodes and elements. Since the ghost elements are constructed during the problem definition and partitioning phase, this is a one-time computation. The assembly of the elements 710 and 712 rely primarily on the field values at the nodes 706 and 708 making up the element. So, when a process updates a field value at its owned node, then there is a requirement to update the corresponding ghost node 714 value so as to keep the computation in sync. Ghost node 714 updating is a message passing affair where adjacent processes send their latest owned node field values to the corresponding ghost nodes 714 of their neighboring processes.

Setting Element Ownership Such that Message Passing is Minimized

When determining which elements will be owned on a specific process, there are downstream message passing concerns that should be addressed. For example, if each process owns all of the elements within its partition, then off-process elements will be required to contribute to the nodal global assembly matrix for nodes that reside on the partition boundary. This requires that element assembly matrix rows for nodes referenced by multiple processes will be sent via message passing. Such message passing is undesirable since each row of the element assembly matrix contains multiple terms and the message bandwidth is increased.

A better solution is to add an extra layer of elements along the boundary of each mesh partition so that all locally owned nodes have all the contributing elements they need during matrix assemble. In this regard, the elements along the boundary of each mesh partition are not owned by any local nodes. Such a configuration avoids sending any element contributions via message passing. This adds to the local element count somewhat on each process as there are locally owned elements and some non-owned elements that exist solely to avoid message passing during the assembly process.

Since the extra elements are physically added to the local partition's database, they will be assembled just like the owned-elements of the partition. The instruction looks like "assemble owned and non-owned elements". This results in the owned rows of the coefficient matrix being computed.

Balancing Owned Node Counts on Each Process

Each local node set on a process requires either an owned or non-owned status. Referring to FIGS. 7A-7E, this is accomplished using a two pass approach (as described above). In the first pass, nodes 706 that are only referenced by elements on their local partition 704, are marked as owned (e.g., by the process that is mapped to that node). In the second pass, all other node's ownership is determined by listing the processes that make a reference (to each node) and comparing the current locally owned counts (for the referencing process). The referencing process with the lowest owned node count is granted ownership of the shared node 708. In this way, the owned node count on all processes will be approximately equal and will result in more balanced execution.

For example, suppose the following example:

Process P1 references a node N1 that only references elements E1-E3 that are in the N1's local partition (e.g., elements 710);

Process P2 references a node N2 that references elements E4, E5, and E6, wherein E4 and E6 are within N2's local partition (e.g., similar to elements 710), but E5 is on the boundary of a partition (e.g., elements 712); P2 also references a node N3 that only references elements E7 and E8 that are within N3's local partition;

Process P3 only references N2.

In the above example, in the first pass, node N1 is marked as owned by P1, and node N3 is marked as owned by P2. In the second pass, since P2 and P3 both reference N2, P2 and P3 are listed and their node counts are compared. Process P2 has a node count of 1 (due to its ownership of N2). Process P3 has a node count of 0 (since it does not own any other nodes). As P3 has the lowest node count, P3 is granted ownership of the shared node N2.

Local Assembly

Local node and element numbering is used on each process and this allows for "local" assembly, which when carried into the solve phase, avoids any mapping or renumbering overheads. In other words, no local to global or local to global assembly mapping is employed. Rather, local indices are used for all processes with the knowledge that owned nodes give rise to sequential rows in governing matrices, with process 0 representing matrix block 0, process 1 representing matrix block 1, etc. This simplifies local matrix assembly and matrix solver design.

Figure 6B:
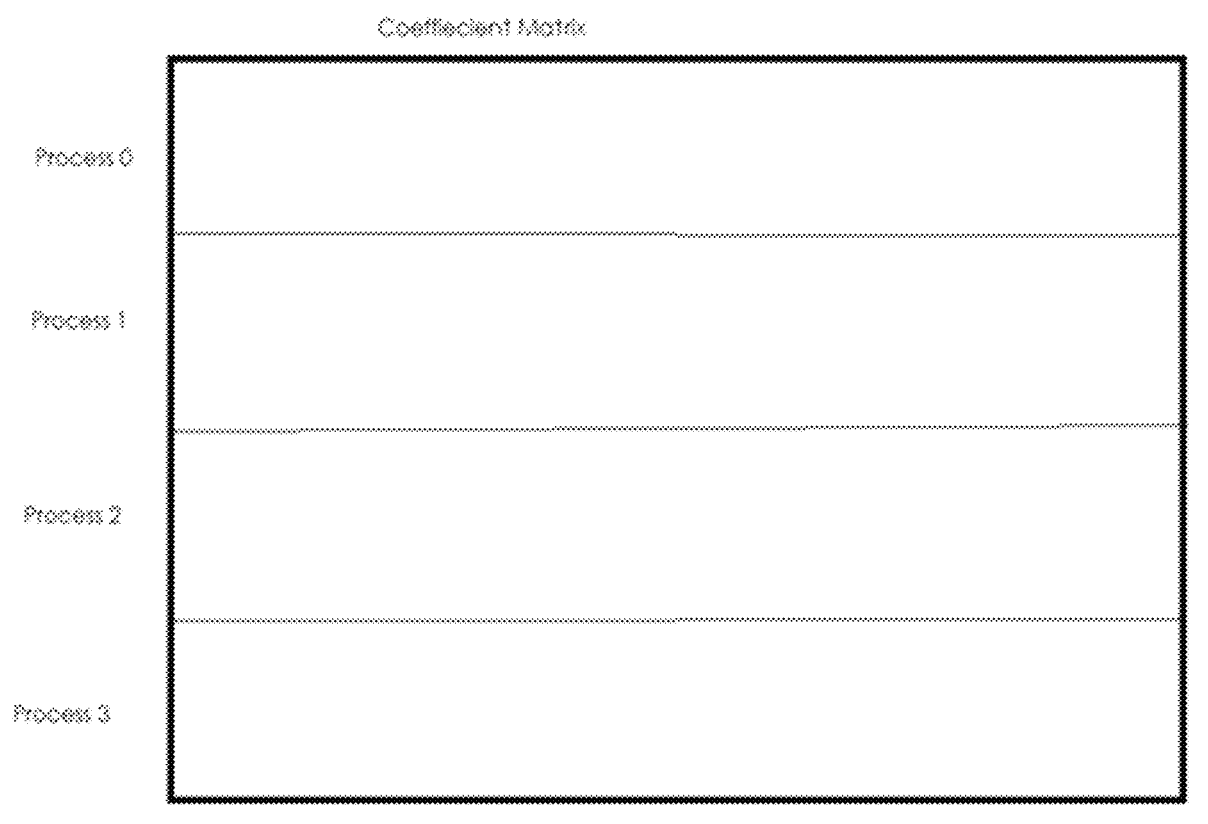

The coefficient matrix (e.g., of FIG. 6A) is a numerical representation of the conservation equation being solved. The rows of this matrix are made up of coefficients generated by all the owned nodes of each partition. FIG. 6B illustrates an exemplary layout of a coefficient matrix in accordance of one or more embodiments of the invention.

For illustration purposes, suppose that there are one thousand (1000) nodes in the original mesh. In a four-way partition, each process is given two-hundred and fifty (250) owned-nodes. In the matrix of FIG. 6B, there are 250 rows of terms in each processor block (i.e., Process 0, Process 1, Process 2, and Process 3). For the original mesh, all numbering would run from 0 to 999. However, for this distributed, multi-process environment, each process (i.e., Process 0, Process 1, Process 2, and Process 3) has owned-nodes numbering 0 to 249. Slave nodes are numbered above the owned-node count, 250, 251, etc. A local numbering is used for each process.

Accordingly, the use of local numbering simplifies things because the node id in the original mesh need not be considered. One intuitively knows that local node 3 on process 3 has an original mesh node id of 3*250+3=753. However, this information can be completely ignored until results are rendered on the original model.

Message Passing Code is Simplified

As explained above, the addition of extra elements along the boundary of each mesh partition eliminates the need for message passing of element assembly terms. Such an extra layer leaves ghost nodes updates on the partition boundaries as the only type of message passing required. This minimizes message passing software and simplifies overall code design.

As described above, each processor will update field values on the owned-nodes when numerical methods are employed to solve the linear equations represented by the coefficient matrix. The ghost nodes are non-owned and as such have no means of being updated unless the new field data is message passed from the owned-nodes on processor i to the corresponding ghost node on processor j. A message passing data structure is computed at the start of a simulation that associates the send nodes (owned, processor i) and the corresponding receive nodes (non-owned, ghost nodes, processor j). This structure allows for the packing of ghost values into a single efficient data array and minimizes message passing latency.

Element Assembly Coloring

Within a single machine, it is possible to access multiple cores by dividing up the various tasks performed within/by a method such that multiple computational threads will simultaneously complete a task. A simple example of this would be taking a "for" loop and assign different index ranges to each thread. This is all done in the context of shared memory. The idea being that a single global memory is available to all threads belonging to a process. Since all threads are sharing the same memory space, it is imperative that multiple threads do not try to write to the same memory space simultaneously. Or equally as bad, one thread writes at the same time another thread is trying to read a piece of memory. This issue is known as memory contention. One solution is to place locks around these critical sections of code and control the memory access such that only one thread at a time can be in the critical section. However, if a lot of memory access is required, then doing millions of memory locks will kill all parallel performance.

The better approach is to sequence the overall computation in a way to avoid memory contention. For example, in Finite Element computations, global system matrices are formed by assembling element contributions. In the assembly process, element contributions are added to the nodes of each element. Since many elements reference the same nodes, a memory contention problem exists. To avoid the memory contention altogether, elements can be grouped by colors. Historically, in numerical literature, the term colors is synonymous with groups. However, since group theory is a separate field of mathematics, the term color is often used in the area of computer numerical methods. Each color represents a group of elements whose node referencing does not intersect. In practice, one may find that even the largest of problems may require around 50 to 70 colors. Thread synchronization is required after each color group is processed to avoid contention. Compared to requiring a memory lock for each and every element, the use of coloring is much more effective.

Using the mesh described above, one may note that the element color mapping may be as follows,

| Color index | Color | Number of elements |
|---|---|---|
| 0 | Red | 24 |
| 1 | Orange | 24 |
| 2 | Yellow | 17 |
| 3 | Green | 18 |
| 4 | Blue | 6 |
| 5 | Purple | 4 |
| | Total | 93 |

Figure 8:
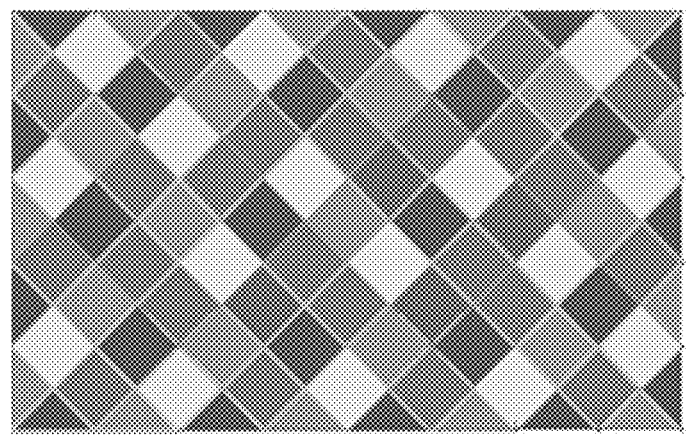
FIG. 8 illustrates a color map in accordance with one or more embodiments of the invention.

FIG. 8 illustrates such a color map in accordance with one or more embodiments of the invention.

The code to assemble the elements may look like this:

```
for ( colon = 0 ; colon < number_of_colors ; colon++ )
{
    for ( ii = elem_ptr[color][tid] ; ii < elem_ptr[color][tid + 1] ; ii++ )
    {
        Element_id = element_map[ ii ];
        Compute element properties
        Form element matrix
        Assemble to coefficient matrix
    }
    Synchronize Threads
}
```

Elem_ptr is loaded with the index of the element ids as a function of color and thread id. Accordingly, colors are used to group elements and to avoid intersecting node references.

For Loop Thread Boundary Optimizer

One of the most common computations within a numerical simulation is the updating of array variables using a "for" loop. An example of "for" loop updates would be looping over elements to form global conservation matrices or looping over two vector arrays to form a dot product. For example,

```
DotProduct = 0.;
for(j = 0; j < N ;++j)
    DotProduct = DotProduct + A[j]* B[j];
```

In the dot product example, j represents the loop index and N represents the total number of items to be updated. When this for loop is partitioned by multiple concurrent threads, the for loop can be rewritten as, for (j=tptr[i];j<tptr[i+1];++j)

Where the thread pointer, tptr is an index by the local thread id shown here as i. If N were 100 and 4 threads were executing the for loop, then i=0, would compute indices 0 through 24, i=1 would execute indices 25 through 49, i=2 would execute indices 50 through 74, and i=3 would execute indices 75 through 99. In other word, tptr=[0, 25, 50, 75, 100] and can be thought of as a thread boundary pointer and it defines the range of indices that are executed by each thread. As the complexity of the calculations grow within the for loop, there is a chance that a 1/N partitioning is not optimal. For example, in a finite element matrix forming loop, the individual threads may encounter different types of elements and this will skew the workloads for the various threads.

A partitioning fraction for thread id i, is represented as, $X_i$, where the sum of the thread partitioning fraction is unity. Using high precision timing functions, the time per index it takes to execute each thread's index range is denoted, $R_i$, allowing the wall clock time spent by each thread, $t_i$, to be represented by, $$t_i = R_i X_i N$$

To minimize the thread execution time, one may require, that each thread will execute in the same amount of time.

$$t = R_0 X_0 N = R_1 X_1 N = R_2 X_2 N = \ldots$$

Combining this with the fact that the sum of the thread partition fraction sum is unity, one may arrive at the result that defines a new set of thread partition fractions to minimize execution time.

$$X_i = \frac{1}{\left[R_i \sum_{j=0}^{N-1} \frac{1}{R_j}\right]}$$

This new set of thread partition fractions can be used to update the thread pointer array, tptr, which will be used the next time the for loop is executed.

Figure 9:
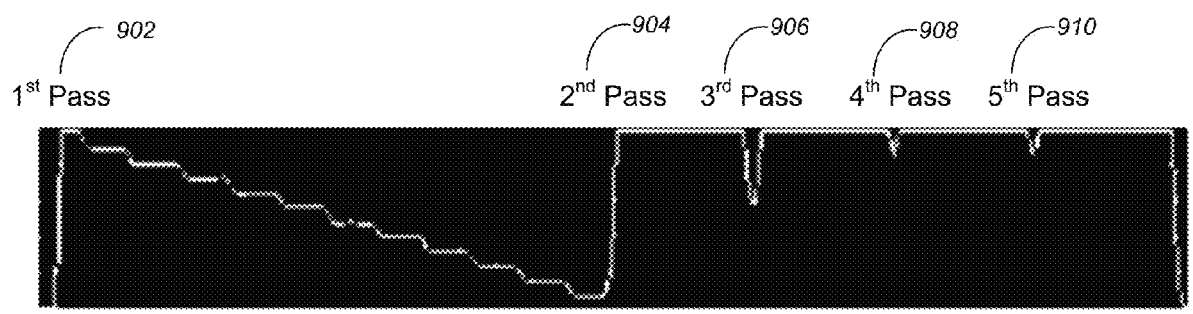
FIG. 9 illustrates a CPU activity trace for partition work loads in accordance with one or more embodiments of the invention.

To illustrate how this works, one may start with 12 threads executing a for loop where the work load is highly skewed. In the CPU activity trace shown in FIG. 9, one can see 12 threads enter the for loop on the first pass 902. When the thread with the lightest load finishes, the CPU activity drops by $1/12^{th}$. This continues in a stair step fashion as the threads with larger workloads complete. When all 12 threads have finish the for loop, the time spent by each thread is used to compute a new set of thread partition fractions and the thread pointer array is updated. Notice that when the threads enter the for loop the second 904 and subsequent times 906-910, all threads are used efficiently, the wall clock is minimized. Note too, that if the work load was changing over time, the optimizer would still function efficiently since it is applied every time the for loop is executed and is constantly adjusting the thread pointer array to yield a minimum execution time.

Thus, an exemplary flow of the boundary optimizer consists of: (1) determining that a for loop is being used to update array variables; (2) computing a partitioning fraction Xi for a thread id i for N total array variables:

$$X_i = \frac{1}{\left[R_i \sum_{j=0}^{N-1} \frac{1}{R_j}\right]}$$

wherein a sum of the partitioning fraction Xi is unity, Ri comprises a time per index to execute each thread's index range;
(3) updating a thread pointer array tptr based on Xi, wherein tptr comprises an array of indices that defines a range of indices that are executed by each thread; and (4) assigning indices to different threads based on the updated thread pointer array tptr.

Matrix Solvers

For each conservation matrix that is formed, a matrix solver is required to solve the matrix system to yield an update for a field variable.

Conservation equations are partial differential equations that describe how field variables vary in space and time. For conservation of energy, the field variable is temperature. Thermal modeling tells us that heat can diffuse via conduction, it can be connected in a flow, or can be transferred via radiation. It is also known that the rate of these changes will depend on the mass and heat capacity of the materials involved. Mathematically, this is represented with the following partial differential equation.

$$\rho C_P \left( \frac{\partial T}{\partial \tau} + \vec{V} \cdot \frac{\partial T}{\partial s} \right) + \nabla k \nabla T = S_T$$

There are well known numerical techniques to convert these differential operators into elemental matrices that can be assembled into a coefficient matrix. These large matrices represent a [A][T]=[b] linear system that can be solved by a variety of matrix solvers. Matrix solvers are available in many types and have evolved over many years.

Each HPC matrix solver will have several characteristics that need to be considered when pairing a specific solver with a particular conservation matrix. For example, things like residual reduction, radius of convergence, stability, and how they deal with ill-conditioned matrices are important characteristics when matching matrix solvers up to matrix systems.

For the engineering simulation space, one typically deals with hyperbolic and elliptical equations. The hyperbolic equations can usually be made well-conditioned by lowering the time step size until a row-wise diagonal dominance results. This allows the use of a simple Jacobi solver which is highly parallelizable. When dealing with steady state solutions, a time accurate solution is not required and the message passing requirement after each Jacobi sweep can be eliminated. For these types of solutions, all message passing within the solver can be avoided.

Elliptical matrix systems are more difficult. Elliptical matrix systems rarely have diagonal dominance and Jacobi solvers cannot be employed. For most elliptical systems, Conjugate Gradient type solvers are preferred and with proper pre-conditioning, can provide reasonable residual reduction, stability, and they can deal with ill-conditioned matrices. However, Conjugate Gradient Solvers require at least one vector message update per solver iteration. This alone will limit overall matrix solver scalability on slower networks.

To keep overall scalability high, a novel combination of approximate and exact matrix solvers are employed to elliptical equation sets to minimize message passing and overall wall clock time. For steady state solutions, this is acceptable and numerical experimentations have shown that just doing one or two Conjugate Gradient solutions per 100 time steps will yield suitable steady solutions while achieving excellent parallel scalability.

In one or more embodiments, after running a large number of analysis types, where the approximate to exact solver application ratio was varied, it was found that doing 50 approximate solves for each exact solve yielded high scalability and a minimization of wall clock time. There is a competition of several factors at play here. Exact matrix solutions (solution accurate to parts per billion) require a high cost in CPU time and their message passing requirements will reduce scalability to nil on a standard speed network. On the plus side, exact solutions to conservation equations will accelerate solutions towards a converged steady solution. Approximate matrix solutions, require little or no message passing and as a result, they enjoy very high levels of scalability. Through trial and error, the optimum application schedule (approximate to exact solver application ratio) was determined to work for a large class of problems.

Maximum Cache Performance

Great care is taken to guarantee sequential memory access such that cache line utilization is maximized. Numerical experiments have shown that when non-sequential access arrays are mapped to a sequential vector, code can execute up to three times faster.

For example, in the piece of code below, the coef array is being accessed using the idcoef array, idcoef[i]. The idcoef[i] array lists the index of the diagonal entries of the coef array and as such, those indexes have a stride approximately equal to the row width of the coef array. For 3D computations, this width is around 20, so idcoef[i] would look like {0, 21, 40, 61, 82, . . . }

```
While ( ! converged )
{
    For ( I = 0 ; I < N ; ++I )
        X[i] = Y[i] / coef[ idcoef[i] ] ;
    .....
}
```

When a new cache line of the coef data is fetched from memory, only $1/20^{th}$ of the fetched data is utilized, reducing computational efficiency. A better approach is to pre-load a sequential array with the diagonal data before proceeding with the original computation.

```
For ( I = 0 ; I < N ; ++I )
    One_over_diag[i] = 1. / coef[ idcoef[i] ] ;
While ( ! converged )
{
    For ( I = 0 ; I < N ; ++I )
        X[i] = Y[i] * One_over_diag[i] ;
    .....
}
```

The use of the One_over_diag[i] sequential array runs three times faster than the first code provided above.

Communication Rings

When processes need to communicate, it is imperative that the success of the exchange is not dependent on message buffering size. If that dependency exists, a deadlock condition will occur for larger messages and the overall computation will halt.

One solution to the deadlock issue is to conduct the message exchange using the rank ids of the participating processes to control the sequence. In this scheme, for each process pairing, the lower rank process will first receive messages from the higher rank and will then send data back to the higher rank in the second phase of the exchange. Because receive/send and send/receive directives control the exchange sequence, all sends and receives are nicely paired and the deadlock is avoided. The shortfall of this scheme is that many processes with higher rank ids may be waiting for a lower rank process to become available to begin the handshake. In synchronous message passing, you have the situation that processes are essentially waiting at the receive instruction and a low rank can only send data to one process at a time, thus reducing performance to a non-concurrent sequential affair.

As an alternative, one can look at the communication as a number of concurrent exchanges. For example, assume that there are four processes that need to exchange data.

In communication cycle 1, process 0 and process 2 exchange data, while process 1 and 3 exchange data.

In communication cycle 2, process 0 and process 3 exchange data, while process 1 and 2 exchange data.

In communication cycle 3, process 0 and process 1 exchange data, while process 2 and 3 exchange data.

Figure 10A:
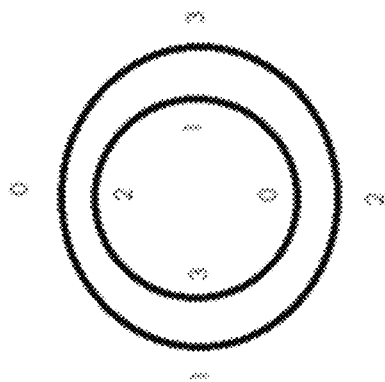
FIGS. 10A-10C illustrate a ring structure for communicating messages in accordance with one or more embodiments of the invention.
Figure 10B:
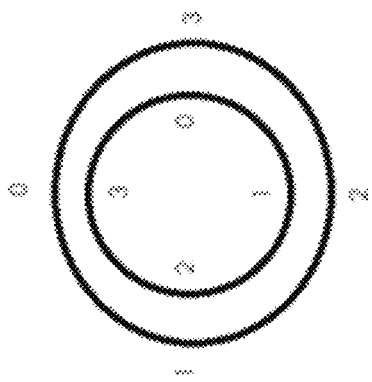
Figure 10C:
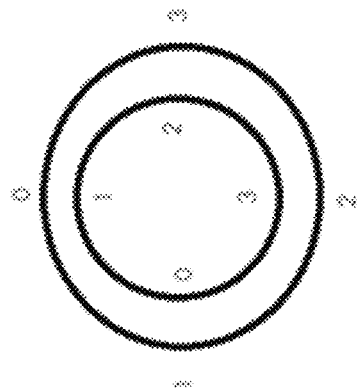

One can also imagine this exchange in a ring structure, where concurrent exchanges are taking place for each exchange cycle. FIGS. 10A-10C illustrate a ring structure for communicating messages in accordance with one or more embodiments of the invention. Three cycles are required for four processes to exchange ghost node data. In the first cycle in FIG. 10A, process 0 sends owned node data to process 2 to be used to update process 2's ghost nodes. Once that completes, process 2 will send its owned node data back to process 0, thus updating the ghost nodes of process 0. The same types of send-receive pairings are simultaneously occurring between process pairs 1 & 3. FIG. 10B shows the next cycle of the exchange involving processes 0 & 3 and 1 & 2. Finally, FIG. 10C illustrates the last cycle with the exchange between processes 0 & 1 and 2 & 3. Note that if there are N processes, then N−1 cycles are required for all necessary communications (each process has communicated with all other processes). This allows for concurrent messaging and parallel scalable is enhanced.

For implementation purposes, the pattern of exchange is represented as a matrix,

| 0 | 2 | 3 | 1 |
| 1 | 3 | 2 | 0 |
| 2 | 0 | 1 | 3 |
| 3 | 1 | 0 | 2 |

In the first column, the process rank id is listed. The columns to the right define the communication partners for each communication cycle. It should be noted that this type of concurrent communication scheme requires that there be an even number of processes.

In view of the above, the use of the communication matrix data is as follows. Each process reads the row of the communication matrix that corresponds to its process id. So, process 0 reads row 0 and sees that it will communicate with process 2 on the first cycle, process 3 on the second cycle 2, and finally process 1 during the third cycle. Process 1 reads the next row of the communication matrix and sees that it will communicate with process 3 during the first cycle, process 2 on the next cycle, and process 0 in the final cycle. Processes 2 and 3 will read from rows 2 and 3 of the communication matrix to determine their pattern of communication. The coding of the ghost node message passing looks like this.

```
for ( ll = 0 ; ll < n_communications ; ll++ )
{
    k = partner[ll];
    if ( k < MyId )
    {
        ... Receive owned node data from process k ...
        ... Load this data in proper ghost node slots ...
        ... Load owned node data bound for process k into message
            buffer
        ... Send owned node message buffer
    }
    else if ( k > MyId )
    {
        ... Load owned node data bound for process k into message
            buffer
```

```
    ... Send owned node message buffer
    ... Receive owned node data from process k ...
    ... Load this data in proper ghost node slots ...
    }
}
```

The number of cycles is given by the variable n_communications which is equal to the number of communicating processes minus one. The partner array is the row data of the communication matrix. Note that the determination of who sends first is determined by the process id (also known as process rank).

Code Instrumentation

Timing data may be captured for all routines so that performance studies can be undertaken. In exemplary implementations, the placement of process wait barriers at the top of each routine were found to be very informative to assess the variability of cache efficiency. If some processes had considerably more wait time at the barrier, it would imply that either: (1) work parsing systems/methods are inefficient; or (2) cache line performance on the slow processes is poor. This kind of feedback can be used to test alternate load balancing and cache lining schemes.

Process wait barriers hold each process at the barrier until all processes of a communicator group have entered into the barrier. By recording the arrival and exit times for each process, one can infer which processes arrived late to a particular barrier. For example, an analysis is undertaken where the wait times are recorded at various barriers. Since wait barriers require all processes within the communication group to synchronize at a place in time, barrier wait time is also known as synchronization time. In this example, six (6) processes are running and the synchronization time at the top of each major computational routine is recorded.

Figure 11A:
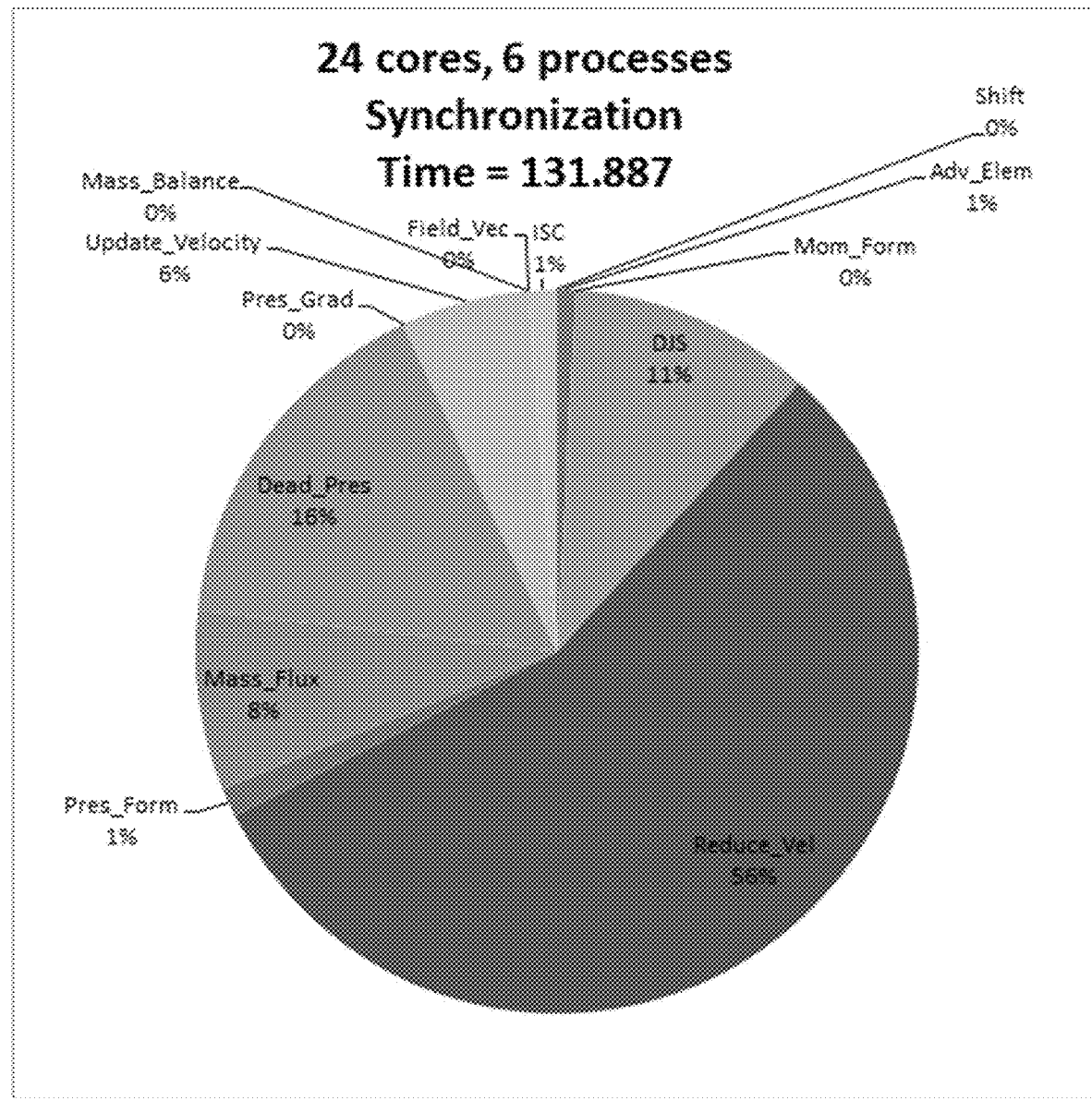
FIGS. 11A-11B illustrate pie charts representing synchronization times in accordance with one or more embodiments of the invention.
Figure 11B:
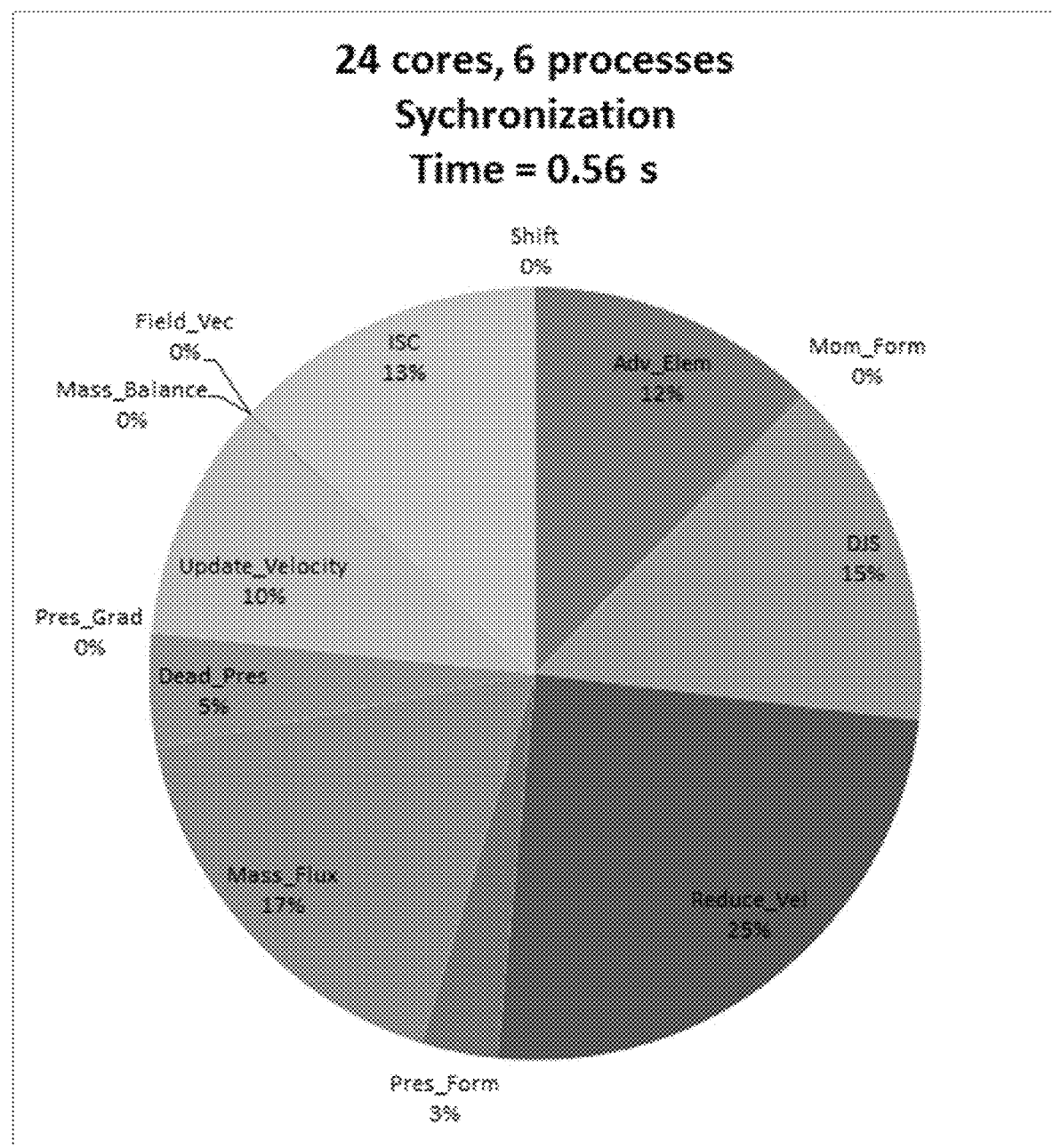

FIGS. 11A-11B illustrate pie charts representing synchronization times in accordance with one or more embodiments of the invention. In FIG. 11A, the pie chart shows that over half of the waiting is occurring at the top of the ReduceVel routine. One can examine the block of code upstream of the barrier wait and examine its effectiveness in terms of work load balancing and the effectiveness of the cache line. If defects are discovered, then new code is written and tested again.

For the case shown above, the data was taken early in the analysis before cache warming had occur. When more barrier wait data was examined later in the same analysis, the cache had warmed and synchronization time had been reduced from 131.887 seconds to 0.56 seconds. This reduction is illustrated in the pie chart of FIG. 11B.

Selective Message Passing

Message passing may be done only at certain stages in the overall simulation. Frequency parameters determine at which stage message passing will be done. These parameters may be determined by doing sensitivity studies such that overall wall clock is minimize and solution stability is ensured.

In particular, when owned node values are updated on each process by the application of a matrix solver, an option is available regarding whether to update the corresponding ghost nodes across a process array. If ghost nodes are not updated, then their field values remain the same and the overall solution is slowed or damped a bit. Depending on the type of analysis, there may be 10 to 20 points in the computation where one must decide if the ghost nodes should be updated or not. At these ghost node update points, frequency values are used to determine when the updates will occur. For example, a frequency value of five (5) means that every fifth iteration, the ghost nodes value will be updated at a certain point in the computation. By running many analyses and varying these frequency values, a range of frequency values that allowed for acceptable run time performance can be determined. Note that there are some competing things to consider:

1. If ghost nodes are not updated often enough, then solutions may converge too slowly. Further, infrequent ghost updates may jolt the solution and instabilities may result.
2. If ghost nodes are updated too often, then message passing overhead may dominate the overall computation and parallel scalability will suffer.

Trial and error provides insights on the proper range of values for each ghost node update decision.

Installation and Configuration

A cluster configurator and launcher were developed to ease installation and running of the code. Clusters can run a variety of operating systems and network hardware/software varies. Care was taken to automate the configuration and installation process so that the simulation on a public grid can run on a variety of hardware.

In particular, for installation and launching, cloud compute nodes are imaged and managed by a provisioning system. Inputs to this system include:

Network speed—so that the system can automatically adapt its solution strategy when high speed network can be exploited; and Message passing options—these can be adjusted so that alternate channel models and the inclusion of environment variables can tune the message passing software for optimal performance.

Logical Flow

Figure 12:
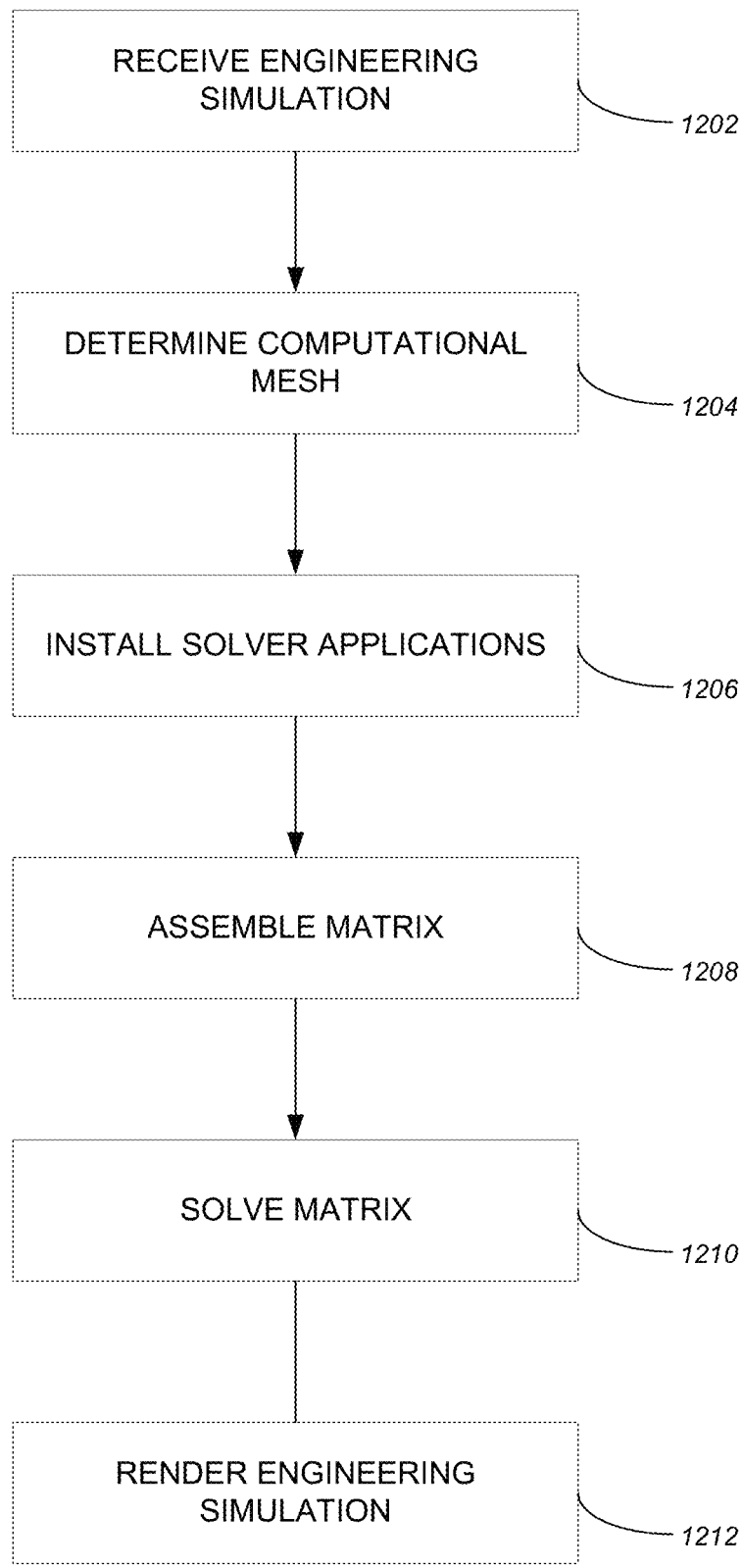
FIG. 12 illustrates the logical flow for performance computing on a public grid in accordance with one or more embodiments of the invention.

FIG. 12 illustrates the logical flow for performance computing on a public grid in accordance with one or more embodiments of the invention.

At step 1202, an engineering simulation for a computer aided-design (CAD) model is received. The engineering simulation includes multiple computations, and each of the multiple computations is a computational process.

At step 1204, a computational mesh to solve the engineering simulation is determined. The computational mesh divides the CAD model up spatially into elements where conservation equations are formed. Vertices of the computational mesh are nodes where field variables are defined. The computational mesh consists of one or more partitions. Each computational process is assigned one partition of the one or more partitions. Each computational process takes ownership of nodes and elements within its partition based on a set of rules.

As part of determining which processes owns which nodes/elements, a determination may be made that a referencing process (of the computational processes) references one of the one or more nodes or one or more elements. In other words, there is one process assigned to each geometric partition and each process will own millions of elements and millions of nodes). Further in this step, no other process references the one of the one or more nodes and one or more elements. Ownership, of the one of the one or more nodes and the one or more elements, can then be assigned to the referencing process. Further, ownership, of the one or more nodes and the one or more elements that reside on a partition boundary (i.e., multiple processes reference these nodes/elements), may be assigned to one process or another process based on leveling workloads between processes.

More specifically, an ownership status of each node may be determined utilizing two passes. During a first pass, each node that only reference elements on a local partition of the node is marked as being owned by a first computational process. During the second pass, two or more computational processes that share a node are identified, node counts of the two or more identified computational processes are compared, and ownership of the shared node is granted to one of the identified computational processes having a lowest node count.

In one or more additional embodiments, all of the elements at a first node that are needed to complete assembly of the first node are identified. An extra layer of the one or more elements along a boundary of the first node is added. Thereafter, during the assembling of the matrix, the extra layer of one or more elements is accessed instead of message passing between two or more of the computational processes.

At step 1206, a solver application is installed on each computer that is used to perform computing (via the computational processes) in the public grid. Each solver application communicates with another solver application in the public grid. Each computer includes a central processing unit (CPU), and each solver application spawns a computational thread to each of one or more cores of each CPU, wherein the computational threads perform the computing. As described above, typically, one worker process is running on each CPU. The machines/computers are typically dual socket/CPU designs, so two (2) worker processes are launched per compute node. Processes can spawn computational threads. These computational threads allow parallel, concurrent computations. Since each CPU (process) has eight (8) physical cores, one thread may be mapped per core. In this way, all the available hardware making up the cluster may be fully utilized.

In one or more embodiments, the nodes within each computational process are numbered locally. Accordingly, a global node numbering of the nodes in the (original) computational mesh is not considered during the computing.

The installation and launch of the solver application on each computer/compute nodes may be performed/managed using a provisioning system. Such a provisioning system may vary a solution strategy based on network speed, and tune message passing based on message passing options.

At step 1208, a matrix is assembled by each of the computational threads computing numerical operators that represent conservation equations. The numerical operators are stored as a coefficient matrix. Thus, the matrix assembly step 1208 is a process where the numerical operators that represent the conservation equations are computed by all threads. The results of this computation are stored in memory as an enormous coefficient matrix. This coefficient matrix is laid out as was shown in FIG. 6A-6B. The coefficient matrix data is fully distributed across all worker processes.

At step 1210, the matrix is solved by solving the conservation equations represented by the coefficient matrix, wherein the solving yields field vectors that describe/update the field variables at the one or more nodes. Thus, in step 1210, the linear set of equations that the coefficient matrix represents is solved. In engineering simulations, these conservation equations represent conservation of momentum, energy, mass, concentration, etc. Each conservation equation yields a coefficient matrix whose solution yields the field vectors that describes the velocity, pressure, temperature, concentration, etc. at all the mesh nodes. There are standard matrix solvers (numerical methods) that can be employed to derive these solution vectors.

Ordinarily, message passing of node/element assembly terms and variables requires message passing between owned nodes and non-owned nodes (i.e., ghost nodes). In one or more embodiments of the invention, a message passing data structure is computed that associates a send node, of the nodes that are owned, with a receive node, of the nodes that are not owned. The field variables are packed into the message passing data structure and the field variables are updated during the solving step. In this regard, the message passing data structure is used by the send node and the receive node to improve a speed of message passing between the computational processes (thereby improving efficiency).

To further reduce/minimize message passing and to provide scalability, a specific matrix solver may be paired with a particular coefficient matrix (compared to different pairings). Such a pairing may be based on an analysis of a combination of approximate and exact matrix solvers. Further, a frequency value may be used that determines how often to update the field variables of non-owned nodes (i.e., ghost nodes).

In addition to the above, a ring structure may be utilized for communicating messages between computational processes. Concurrent exchanges are executed for each message exchange cycle, and the number of message exchange cycles is equal to the number of the computational processes minus one (1).

At step 1212, the engineering simulation is rendered based on the updated field variables. Thus, the updated field variables at the nodes can be sent to a rendering system that can display a realistic image of the actual system/engineering simulation under various operating conditions. These animations can allow a designer to view their design in a virtual reality environment.

In one or more embodiments of the invention, the one or more elements are divided into different groups (e.g., color groups). Each group is a group of elements whose node referencing does not intersect. For each different group, element properties are computed. The matrix assembly is then based on the computed element properties within each different group. The computational threads are synchronized after each different group is processed. In other words, within each group, there are no intersections and hence no memory contention that will cause a processing delay/problem.

In one or more embodiments of the invention, the solver application may optimize the thread boundary using a for loop. In this regard, a first step determines that a for loop is being used to update array variables. A partitioning fraction $X_i$ is computed for a thread id i for N total array variables:

$$X_i = \frac{1}{\left[ R_i \sum_{j=0}^{N-1} \frac{1}{R_j} \right]}$$

wherein a sum of the partitioning fraction $X_i$ is unity, $R_i$ comprises a time per index to execute each thread's index range. A thread pointer array tptr is updated based on $X_i$, wherein tptr comprises an array of indices that defines a range of indices that are executed by each thread. Further, indices are assigned to different threads based on the updated thread pointer array tptr.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. Further, embodiments of the invention may be executed on a public grid on several machines. In summary, embodiments of the invention provide various strategies to compute engineering solutions efficiently on public grids.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for performance computing on a public grid, comprising:
   (A) receiving an engineering simulation for a computer aided-design (CAD) model, wherein:
      (1) the engineering simulation comprises multiple computations;
      (2) each of the multiple computations comprises a computational process;
   (B) determining a computational mesh to solve the engineering simulation, wherein:
      (1) the computational mesh divides the CAD model up spatially into elements where conservation equations are formed;
      (2) vertices of the computational mesh comprise nodes where field variables are defined;
      (3) the computational mesh comprises one or more partitions;
      (4) each computational process is assigned one partition of the one or more partitions;
      (5) each computational process owns one or more of the nodes and/or one or more of the elements;
      (6) the conservation equations express a conservation of a quantity; and
      (7) each of the one or more nodes comprises a compute node;
   (C) installing a solver application on each computer that is used to perform computing via the computational processes in the public grid, wherein:
      (1) each solver application communicates with another solver application in the public grid;
      (2) each computer comprises a central processing unit (CPU);
      (3) each solver application spawns a computational thread to each of one or more cores of each CPU, wherein the computational threads perform the computing; and
      (4) the public grid has limited network capability as compared to that of a high-performance computing network;
      (5) the solver application provides increased scalability for increasing a number of computers in the public grid as compared to scalability on the public grid without installing the solver application;
   (D) assembling a matrix by each of the computational threads computing numerical operators that represent the conservation equations, wherein the numerical operators are stored as a coefficient matrix;
   (E) determining an ownership status of each node utilizing two passes, wherein:
      (1) during a first pass, marking each node that only references elements on a local partition of the node as being owned by a first computational process; and
      (2) during a second pass:
         (i) identifying two or more computational processes that share one of the nodes;
         (ii) comparing node counts of the two or more identified computational processes; and
         (iii) granting ownership of the shared node to one of the identified computational processes having a lowest node count;
   (F) solving the matrix by solving the conservation equations represented by the coefficient matrix, wherein the solving yields field vectors that update the field variables at the one or more nodes; and
   (G) rendering the engineering solution based on the updated field variables.

2. The computer-implemented method of claim 1, further comprising:
   determining that a referencing process, of the computational processes, references one of the one or more nodes or one or more elements, and no other process references the one of the one or more nodes and one or more elements;
   assigning ownership, of the one of the one or more nodes and the one or more elements, to the referencing process; and
   assigning ownership, of the one or more nodes and the one or more elements that reside on a partition boundary, to one process or another process based on leveling workloads between processes.

3. The computer-implemented method of claim 1, further comprising:
   identifying all of the one or more elements at a first node (of the nodes) that are needed to complete an assembly of the first node;
   adding an extra layer of the one or more elements along a boundary of the first node; and
   during the assembling of the matrix, utilizing the extra layer of the one or more elements instead of message passing between two or more of the computational processes.

4. The computer-implemented method of claim 1, further comprising:
   numbering the one or more of the nodes within each computational process locally, wherein a global node numbering of the one or more nodes in the computational mesh is not considered during the computing.

5. The computer-implemented method of claim 1, further comprising:
   computing a message passing data structure that associates a send node, of the nodes that are owned, with a receive node, of the nodes that are not owned;
   wherein:
      the field variables are packed into the message passing data structure;

the field variables in the message passing data structure are updated during the solving; and the message passing data structure is used by the send node and the receive node to improve a speed of message passing between the computational processes.

6. The computer-implemented method of claim 1, further comprising:

dividing the one or more elements into different groups, wherein each group comprises groups of elements whose node referencing does not intersect;

for each different group, computing element properties, and wherein the assembling the matrix is based on the computed element properties within each different group; and synchronizing the computational threads after each different group is processed.

7. The computer-implemented method of claim 1, further comprising:

determining that a for loop is being used to update array variables;

computing a partitioning fraction Xi for a computational thread id i for N total array variables:

$$X_i = \frac{1}{\left[R_i \sum_{j=0}^{N-1} \frac{1}{R_j}\right]}$$

wherein a sum of the partitioning fraction Xi is unity, Ri comprises a time per index to execute each thread's index range;

updating a thread pointer array tptr based on Xi, wherein tptr comprises an array of indices that defines a range of indices that are executed by each computational thread; and assigning indices to different computational threads based on the updated thread pointer array tptr.

8. The computer-implemented method of claim 1, wherein the solving the matrix comprises:

analyzing combinations of approximate matrix solvers and exact matrix solvers to determine a pairing of a specific matrix solver with a particular coefficient matrix that minimizes message passing compared to different pairings between specific matrix solvers and particular coefficient matrices, and wherein the pairing provides scalability for increasing a number of computers in the public grid.

9. The computer-implemented method of claim 1, wherein the solving the matrix further comprises:

utilizing a ring structure for communicating messages between computational processes, wherein concurrent exchanges are executed for each message exchange cycle, and wherein a number of message exchange cycles is equal to a number of the computational processes minus one.

10. The computer-implemented method of claim 1, further comprising:

specifying a frequency value that determines how often to update the field variables of non-owned nodes of the one or more nodes.

11. The computer-implemented method of claim 1 wherein the installing the solver application comprises:

managing the installing using a provisioning system, wherein the provisioning system:

varies a computational engineering solution strategy that is used to compute the engineering solution used by the solver application, based on network speed; and tunes message passing.

12. The computer-implemented method of claim 1, wherein the engineering solution is based on engineering calculations performed using the public grid with an efficiency and computational capability of the engineering calculations as performed on the high-performance computing network.

13. An apparatus for performance computing on a public grid system comprising:

(A) multiple computers operating on a public grid, wherein on one or more of the computers:

(1) receive an engineering simulation for a computer aided-design (CAD) model, wherein:

(a) the engineering simulation comprises multiple computations;

(b) each of the multiple computations comprises a computational process;

(2) determine a computational mesh to solve the engineering simulation, wherein:

(1) the computational mesh divides the CAD model up spatially into elements where conservation equations are formed;

(2) vertices of the computational mesh comprise nodes where field variables are defined;

(3) the computational mesh comprises one or more partitions;

(4) each computational process is assigned one partition of the one or more partitions;

(5) each computational process owns one or more of the nodes and/or one or more of the elements;

(6) determine an ownership status of each node utilizing two passes, wherein:

(a) during a first pass, the one or more computers mark each node that only references elements on a local partition of the node as being owned by a first computational process; and (b) during a second pass, the one or more computers:

(i) identify two or more computational processes that share one of the nodes;

(ii) compare node counts of the two or more identified computational processes; and (iii) grant ownership of the shared node to one of the identified computational processes having a lowest node count;

(7) the conservation equations express a conservation of a quantity; and (8) each of the one or more nodes comprises a compute node; and (B) a solver application installed on each of the multiple computers, wherein:

(1) each solver application communicates with another solver application in the public grid;

(2) each of the multiple computers comprises a central processing unit (CPU);

(3) each solver application spawns a computational thread to each of one or more cores of each CPU, wherein the computational threads perform the computing via the computational processes;

(4) the public grid has limited network capability as compared to that of a high-performance computing network;

(5) the solver application provides increased scalability for increasing a number of computers in the public grid as compared to scalability on the public grid without installing the solver application;

(6) a matrix is assembled wherein each of the computational threads computes numerical operators that represent conservation equations, wherein the numerical operators are stored as a coefficient matrix;

(7) the matrix is solved by solving the conservation equations represented by the coefficient matrix, wherein the solving yields field vectors that update the field variables at the one or more nodes; and (8) the engineering solution is rendered based on the updated field variables.

14. The apparatus of claim 13, wherein the one or more computers:
determines that a referencing process, of the computational processes, references one of the one or more nodes or one or more elements, and no other process references the one of the one or more nodes and one or more elements;
assigns ownership, of the one of the one or more nodes and the one or more elements, to the referencing process;
assigns ownership, of the one or more nodes and the one or more elements that reside on a partition boundary, to one process or another process based on leveling workloads between processes.

15. The apparatus of claim 13, wherein:
the one or more computers identify all of the one or more elements at a first node (of the nodes) that are needed to complete an assembly of the first node;
identify shared elements that are referenced by two or more nodes;
the one or more computers add an extra layer of the one or more elements along a boundary of the first node; and
during the assembly of the matrix, the solver application utilizes the extra layer of the one or more elements instead of message passing between two or more of the computational processes.

16. The apparatus of claim 13, wherein the one or more computers:
number the one or more of the nodes within each computational process locally, wherein a global node numbering of the one or more nodes in the computational mesh is not considered during the computing.

17. The apparatus of claim 13, wherein the one or more computers:
compute a message passing data structure that associates a send node, of the nodes that are owned, with a receive node, of the nodes that are not owned;
wherein:
the field variables are packed into the message passing data structure;
the field variables in the message passing data structure are updated during the solving; and
the message passing data structure is used by the send node and the receive node to improve a speed of message passing between the computational processes.

18. The apparatus of claim 13, wherein the one or more computers:
divide the one or more elements into different groups, wherein each group comprises groups of elements whose node referencing does not intersect; for each different group, compute element properties, and wherein the assembling the matrix is based on the computed element properties within each different group; and
synchronize the computational threads after each different group is processed.

19. The apparatus of claim 13, wherein the one or more computers:
determine that a for loop is being used to update array variables;
compute a partitioning fraction Xi for a computational thread id i for N total array variables:

$$X_i = \frac{1}{\left[ R_i \sum_{j=0}^{N-1} \frac{1}{R_j} \right]}$$

wherein a sum of the partitioning fraction Xi is unity, Ri comprises a time per index to execute each thread's index range;
update a thread pointer array tptr based on Xi, wherein tptr comprises an array of indices that defines a range of indices that are executed by each computational thread; and
assign indices to different computational threads based on the updated thread pointer array tptr.

20. The apparatus of claim 13, wherein the solver application solves the matrix by:
analyzing combinations of approximate matrix solvers and exact matrix solvers to determine a pairing of a specific matrix solver with a particular coefficient matrix that minimizes message passing compared to different pairings between specific matrix solvers and particular coefficient matrices, and provides scalability for increasing a number of computers in the public grid.

21. The apparatus of claim 13, wherein the solver application solves the matrix by:
utilizing a ring structure for communicating messages between computational processes, wherein concurrent exchanges are executed for each message exchange cycle, and wherein a number of message exchange cycles is equal to a number of the computational processes minus one.

22. The apparatus of claim 13, wherein the one or more computers:
specify a frequency value that determines how often to update the field variables of non-owned nodes of the one or more nodes.

23. The apparatus of claim 13, wherein the solver application is installed by:
managing the installing using a provisioning system, wherein the provisioning system:
varies a computational engineering solution strategy that is used to compute the engineering solution used by the solver application, based on network speed; and
tunes message passing.

24. The apparatus of claim 13 wherein the engineering solution is based on engineering calculations performed using the public grid with an efficiency and computational capability of the engineering calculations as performed on the high-performance computing network.

* * * * *